United States Patent [19]

Pearson

[11] Patent Number: 4,803,523
[45] Date of Patent: Feb. 7, 1989

[54] MEANS AND METHOD FOR COLOR SEPARATION AND FOR REPRODUCTION

[75] Inventor: Robert E. Pearson, Portland, Oreg.

[73] Assignee: T. W. Secrest, Chehalis, Wash.; a part interest

[21] Appl. No.: 49,771

[22] Filed: May 13, 1987

Related U.S. Application Data

[60] Division of Ser. No. 718,886, Apr. 2, 1985, Pat. No. 4,668,078, which is a continuation-in-part of Ser. No. 419,304, Sep. 17, 1982, Pat. No. 4,509,854, which is a continuation-in-part of Ser. No. 399,805, Sep. 24, 1973, Pat. No. 4,355,888.

[51] Int. Cl.⁴ .................. G03B 27/32; G03B 27/52; G02B 5/23; G02F 1/01
[52] U.S. Cl. .................................... 355/32; 350/354; 355/77
[58] Field of Search ............... 355/38, 68, 77, 37, 355/71; 350/353, 354, 357; 358/80, 75; 367/11; 250/338

[56] References Cited

U.S. PATENT DOCUMENTS

| | | | |
|---|---|---|---|
| 2,112,010 | 3/1938 | Brimberg | 358/75 |
| 2,567,240 | 9/1951 | Sites | 358/75 |
| 2,575,714 | 11/1951 | Johnson et al. | 358/75 |
| 3,085,469 | 4/1963 | Carlson | 355/37 |
| 3,443,859 | 5/1969 | Rogers | 350/357 |
| 3,493,300 | 2/1970 | Ware | 355/32 |
| 3,496,662 | 2/1970 | Choate | 350/357 X |
| 3,519,347 | 7/1970 | Bowker et al. | 355/88 |
| 3,521,941 | 7/1970 | Deb et al. | 350/353 |
| 3,533,693 | 10/1970 | Balint | 355/71 |
| 3,552,824 | 1/1971 | Kiss | 350/354 |
| 3,645,188 | 2/1972 | Hamann | 354/354 X |
| 3,714,430 | 1/1973 | Finvold et al. | 250/338 |
| 3,724,947 | 4/1973 | Paulus | 355/38 |
| 3,792,423 | 2/1974 | Becker et al. | 367/11 |
| 3,807,832 | 4/1974 | Castellion | 350/357 |
| 3,844,636 | 10/1974 | Maricle et al. | 350/357 X |
| 4,076,414 | 2/1978 | Tulbert | 355/38 |
| 4,663,663 | 5/1987 | Lee | 355/38 X |

Primary Examiner—Richard A. Wintercorn
Attorney, Agent, or Firm—T. W. Secrest

[57] ABSTRACT

This invention is directed to the separation of electromagnetic radiation into a, plurality, of selective wave length bands or colors. The term color separation, broadly applied, is meant to be the separation of primary and secondary or complementary wave lengths or colors for the purpose of geometric imaging. Such color separation is achieved, substantially, instantaneously, without the loss of wave length energy or color intensity by a novel means of reflection, transmission and color filtration. The separated colors or selective wave length bands can be, substantially, instantaneously, recreated as a geometric image or can be recorded for later recreation as a geometric image such as by photographic or movie films or by tapes; lithographic plated or engravings. Also, the separated colors or selective wave length bands can be used in making printing plates, directly, without using film.

15 Claims, 19 Drawing Sheets

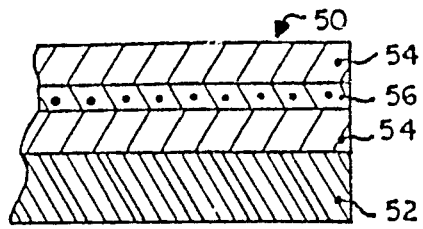
FIG. 1
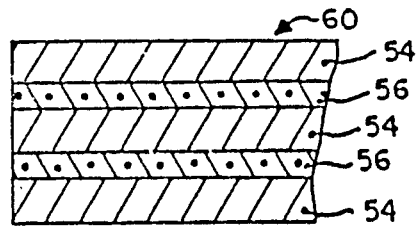
FIG. 2
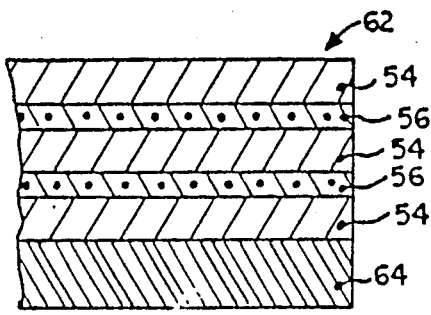
FIG. 3
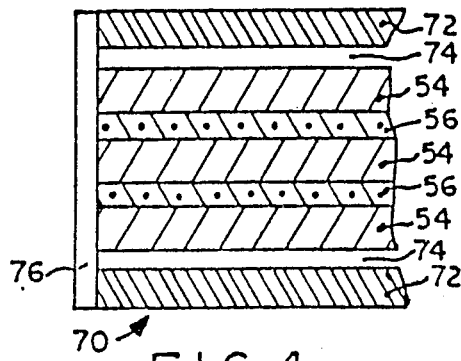
FIG. 4
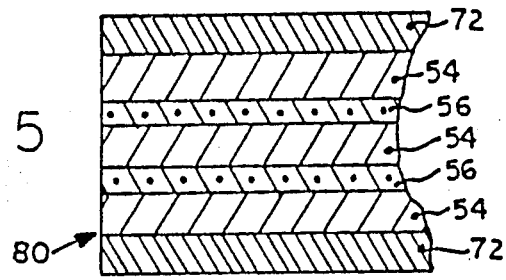
FIG. 5
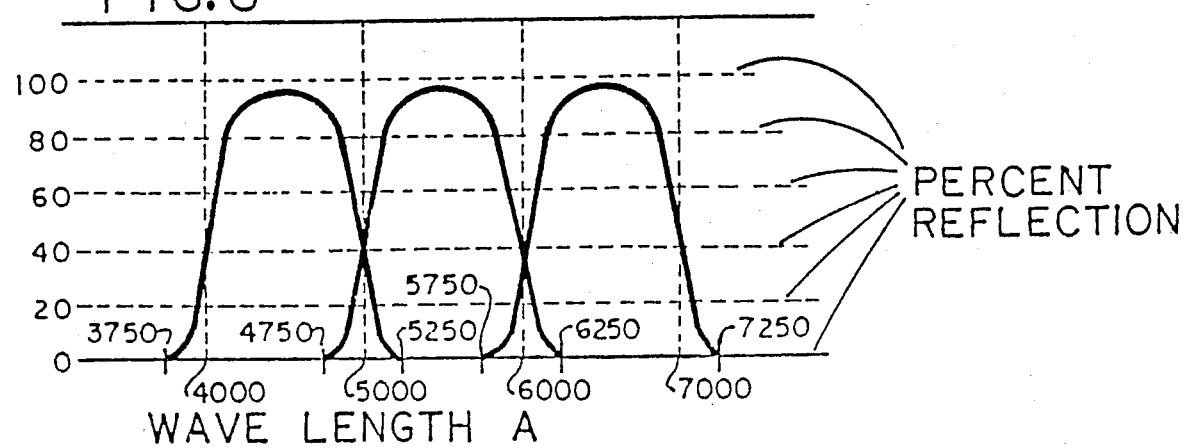

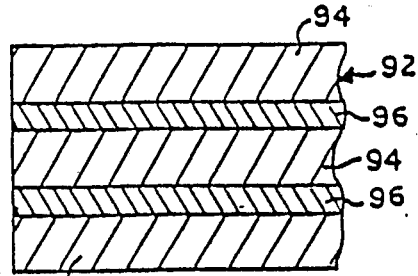
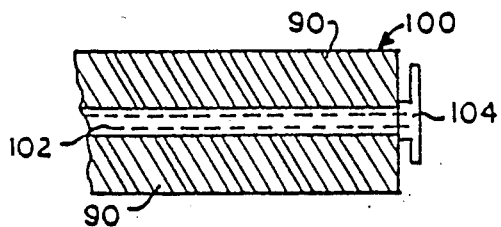
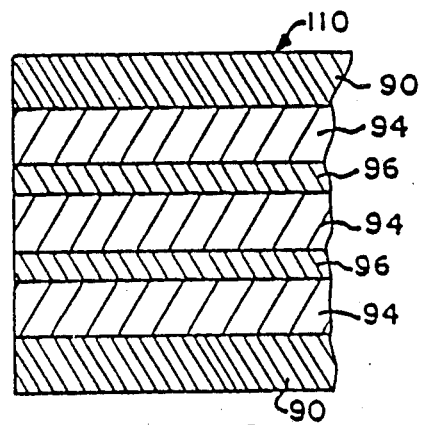
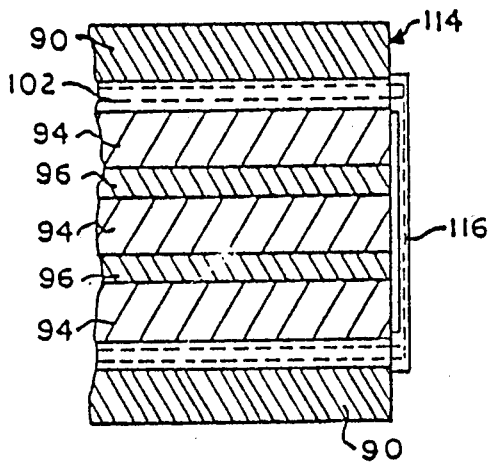
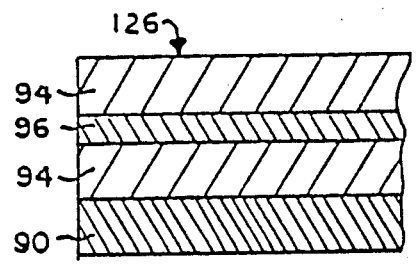
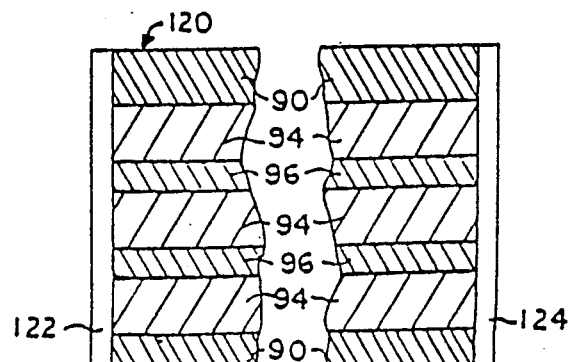
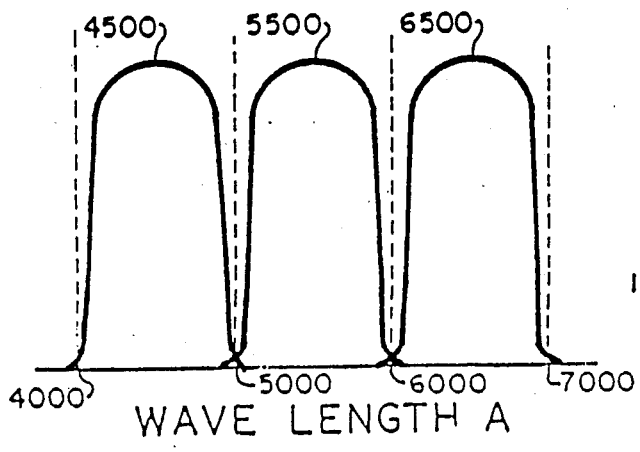

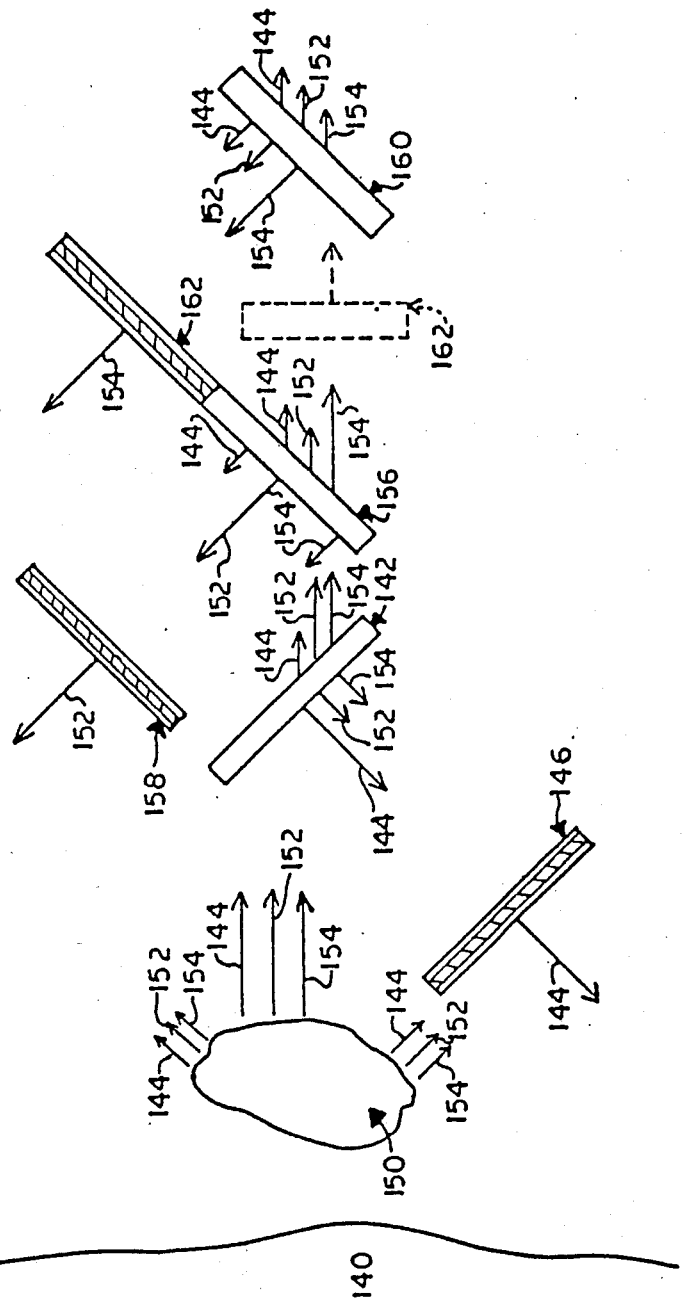
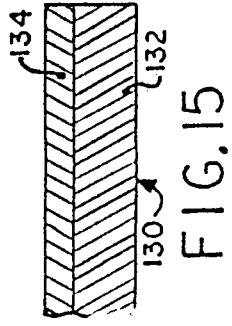
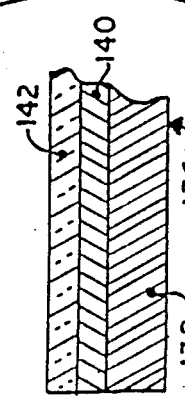

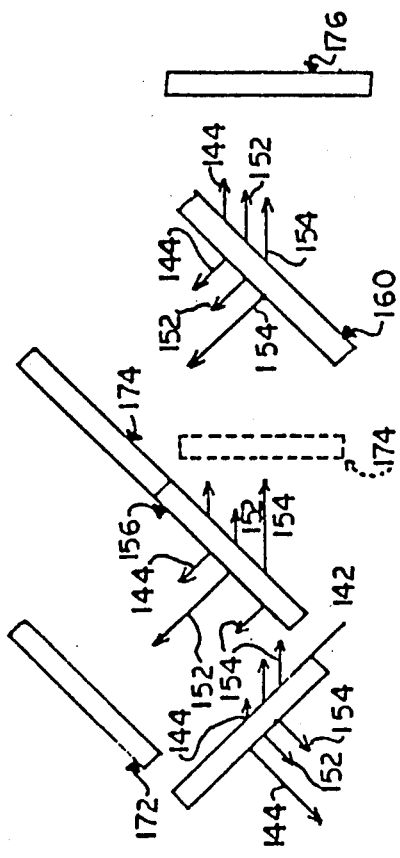
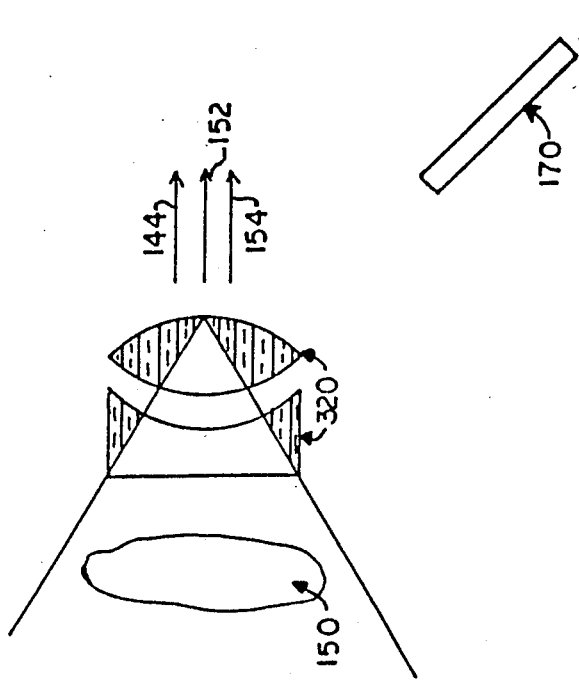
FIG. 24

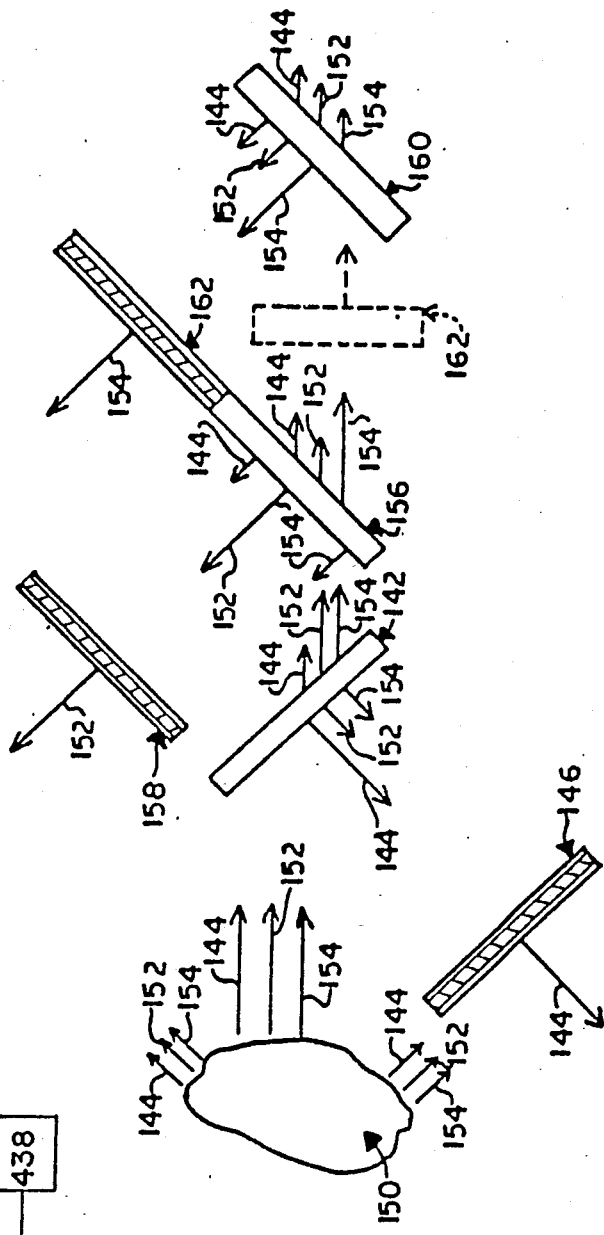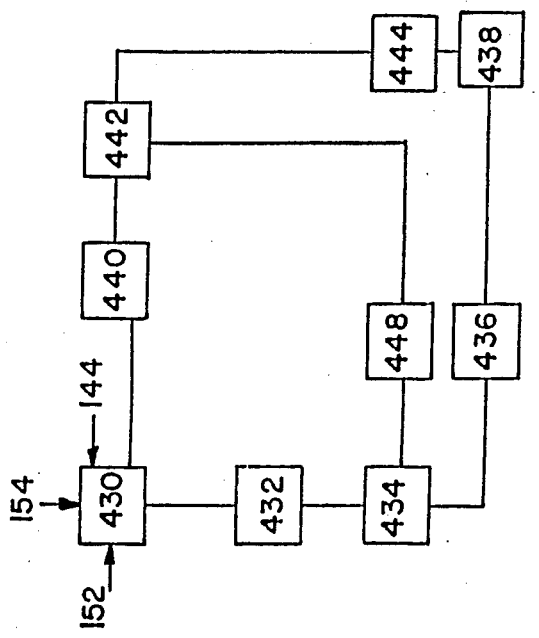
FIG. 31

MEANS AND METHOD FOR COLOR SEPARATION AND FOR REPRODUCTION

This patent application is a divisional patent application of co-pending patent application Ser. No. 718,886, filing date of Apr. 2, 1985, now U.S. Pat. No. 4,668,078, issuing date of May 26, 1987, Ser. No. 419,304, filing date of Sept. 17, 1982, now U.S. Pat. No. 4,509,854, issuing date of May 9, 1985, and which patent application was a continuation-in-part of co-pending patent application Ser. No. 05/399,805, filing date of Sept. 24, 1973, now U.S. Pat. No. 4,355,888, issuing date of Oct. 26, 1982.

This application is a division of application Ser. No. 06/718,886, filed Apr. 2, 1985.

GENERAL BACKGROUND OF THE INVENTION

The quest of man to capture "natural color" in every form of graphic communications has brought about significant technological advancements during the the past three decades. Perfection of "Technicolor" brought a boon to the motion picture industry. The significant break-through in the field of television transmission, via full color, not only stabilized the growth of this giant young industry, but filled the insatiable appetite of the consumer to obtain maximum enjoyment from the "home entertainment center."

The printing, publishing and photographic industries have likewise expended millions of dollars in machinery, equipment and technique in an effort to maintain its market position as required by the consumers' ever-growing demand for high quality reproduction of "natural color".

Consumer products manufacturers, through the advertising community, via all media of communications, continue to pressure publishers toward perfection of reproduction techniques in order to capitalize on the "emotional appeals" so essential to motivating consumers to product introduction and sales growth.

The purpose of this brief explanation is to describe an advanced technique, including perfected equipment in the field of film preparation, as it pertains to the photographic and lithographic reproduction industries with application to related industries. The resultant effect is the ability to offer superior color reproduction at minimized production costs indigenous to consumer demand and reward in vast industry expansion.

To equate and evaluate this advanced technique and equipment, a brief explanation of presently employed processes is essential. All present methods and techniques require an original "Transparency" or "Ectachrome". This is accomplished generally by a professional photographer using standard camera equipment and color film. The majority of commercial photographers use the services of film processing companies for development and finishing their exposed color film. Vary often the elapsed time factor for such processing will be from 3 days to 3 weeks. The average price range of such transparencies will be from $35.00 to $300.00, depending upon size, quantity and degree of labor, i.e. distant location, studio equipment, models, etc. required.

It is not the purpose of this explanation to evaluate or judge the quality of transparencies. Mention is made only to explain the necessity of transparencies in the present method of film preparation for reproduction, but more importantly, to emphasize that with the techniques of this invention (as detailed later), the requirement of the original transparency is completely eliminated. The system does not, obviously, eliminate the photographic studio, models, props, etc., but when employed by the studio photograher, it does eliminate the use of color film. Of equal importance to the photographic and lithographic community is the knowledge that the new technique and equipment have the ability and flexibility to prepare film for reproduction from an original transparency with equal qualitative results without modification of equipment or system.

CONVENTIONAL SYSTEM, COLOR SEPARATION, DESCRIBED

Step I: Transparency is evaluated for color quality and color densities through the use of a transmission densitometer.

Step II: Transparency is placed in back-lighted film carrier of standard commercial reproduction camera and illuminated.

Step III: Recorded data from density evaluation is programmed into a semiautomatic exposure control device dictated by the aim-points of highlight and shadow.

Step IV: Color filter is positioned in camera, unexposed film is positioned, film is exposed to prepare "color masks." "Color masks" are prepared and utilized in later sequences to correct impurities remaining in the original color separation. Depending upon the system employed, one, two or three masks are required in the process, each utilizing a separate film and film exposure, including process development.

Step V: Color filter is positioned, unexposed film is positioned, film is exposed to prepare a continuous tone negative for the "Yellow" printer.

Step VI: Step V repeated for the "Cyan" printer or the blue printer.

Step VII: Step V repeated for the "Magenta" printer or the red printer.

Step VIII: Step V repeated for the "Black" printer.

Step IX: In addition to removing undesirable color from each negative through the exposed mask, additional color correction may be accomplished by chemical treatment of each individual negative either in spot areas or overall.

Step X: When the desired tonal densities are attained, the negative for the Yellow printer is repositioned, along with an additional unexposed film, plus the halftone screen. This step may be accomplished by either the projection or contact method. The screen angle for the Yellow printer is positioned at 90° and generally, three exposures are made to the unexposed film for highlight, shadow and detail.

Step XI: Step X repeated for the Cyan printer with the screen angle positioned at 105°.

Step XII: Step X repeated for the Magenta printer with the screen angle positioned at 75°.

Step XIII: Step X repeated for the Black printer with the screen angle positioned at 45°.

Steps XIV, XV, XVI and XVII: The finished films are now ready for color proofing. This is accomplished by several methods, each requiring a light-sensitive emulsioned carrier, an exposure for each color to be printed, development of each carrier and a reproduction upon either paper, film or another surface. It is not the purpose of this explanation to determine the merit of any color proofing system. The purpose is to define the method steps required, but more importantly, to eliminate these steps entirely and replace them with an electronic proofing system as described in the new technique.

Step XVIII: If total color balance has been attained, finished films are ready to be "plated" for the mechanical process selected, i.e. engravings or lithograph plates. More often than not, however, additional color correction is required either in minute spot areas or overall, due to the maximum densities allowable, based upon the type of printing equipment, printing inks and paper (or printing surface) selected. If spot color correction is desired, the areas affected may be dot-etched, a chemical process altering the size and sometimes shape of the halftone dot on the film. It may be required on all four finished films or only on one, two or three, depending upon the desired results. If it is determined that overall densities of the films exceeds the capability of the reproduction method or equipment selected, it may be necessary to reduce dot structure overall on one or more of the films. This is known as under-color removal and often requires repeating several steps of the entire procedure to prepare a finished film of the required density. Based on the above, it is not possible to define or retrace the steps actually required.

Time required for the foregoing: 4 to 5 hours
Camera Equipment Cost: $25,000.00 to $50,000.00.

Equipment cost varies due to size and degree of electronic sophistication employed in any installation. Support equipment is not included, since it is understood that certain equipment, i.e. dry to dry film processors, continuous-tone and ortho-mechanical, will be a requirement of all systems.

Color scientists analyzed the problem of color printing not only in terms of optics but also mathematics. Seen as a problem of mathematics, the task of color separating and color correcting consists of determining the correct distribution and size of each color dot in every area.

The average lithographic reproduction consists of not less than 12,500 and up to more than 30,000 individual dots per square inch, or of not less than 50,000 and up to more than 120,000 dots in the four colors of ink normally used.

The first electronic color separation was introduced in 1955, now known as the PDI Electronic Color Scanner. In recent years, additional electronic scanning equipment had been placed on the market, i.e. Fairchild Scan-A-Color, Crosfield Scanatron, HPK-Autoscan, to mention only a few.

All the electronic systems include a certain amount of color correcting, a necessity as previously described, due to basic impurities remaining in the system. Color scanned separations are based on the usual color filters. Some scanners can use both reflective as well as transmitted (transparency) copy.

A general description of electronic color separation and color correction is as follows: The color copy is positioned in the machine, where it is scanned by a light beam. Each minute area is evaluated electronically in terms of the transmission or reflective value of each primary color. As in the conventional manual process system, an exposure must be evaluated and projected for each individual color, i.e. yellow, cyan, magenta and black. In this area the steps required are practically identical with the conventional manual system.

The color values are translated into electrical currents by photocells. The computers evaluate the currents which represent the influence of ink, paper, tonal range, etc. It is to be noted that this information is programmed by a trained technician and therefore subject to human calculation and error. The modified currents are conducted into an exposing light source. The source varies in intensity in proportion to the corrected values of each of the elements in the scanned area and so exposes the corrected color on the projected film.

Most electronic scanners produce a balanced set of continuous separations, although later models are capable of producing direct screen halftone images. Under-color removal may be accomplished in the computation and programming, although the masking system is often employed on continuous tone negatives to insure removal of undesirable color-mix for full fidelity reproduction.

From the standpoint of time consumed, as compared with the manual process, the lines per inch dictate the scanning time required: i.e. (averages) at 500 lines per inch, scanning time is, for a full 8×10, 48 minutes per color; at 1,000 lines, 96 minutes; at 1,250 lines, 120 minutes. While each electronic scanner varies to some extent, depending upon the degree of electronic computative sophistication, the basic function is as described. Support equipment, for practical purposes, is identical to the conventional manual system of color film, color separation system.

Time factor: $1\frac{1}{2}$ to $2\frac{1}{2}$ hours.
Scanning equipment cost: (excluding support equipment) $100,000.00 plus

GENERAL DESCRIPTION OF THE INVENTION

This invention, generally, relates to a system and means for modulating, monitoring and color separating electromagnetic waves via color filtration and to reproducing geometric images. The term separated colors, broadly applied, is meant to be selected and specific electromagnetic wave length bands, whether in the visible or non-visible wave length ranges, and are so separated by means of optical filtration. Such optical filtration being interference and/or subtractive in nature being capable of selecting and separating specific wave lengths, singly, or plural within a given wave length range.

More specifically the novel system claims a means known in part by prior art as dichroic reflection; a means known in part by prior art as subtractive color filters; a means known in part by prior art as a camera system; and, a means known in part by prior art as photochromic and/or phototropic compounds or compositions.

Prior art recognizes the disadvantages of ordinary subtractive and/or absorption and/or interference filters wherein density characteristics are pre-established by formula of manufacture. The most common disadvantages are non-resistant to fade and high temperature; far from ideal absorption/reflection/transmission characteristics; extreme high density resulting in degradation of color; extreme low density resulting in irregular reflection/transmission.

In the context of this unique and novel system, photochromic compounds and compositions are meant to be those elements by nature containing properties characteristic of reversibly increasing optical density upon actinic radiation and/or electronic impulse and which contain submicroscopic crystals of silver halides such as silver chloride and/or silver bromide and/or silver iodide, or a dyestuff or a dye with such optical density decreasing upon removal of such radiation or impulse.

A specific object of this novel system is to provide a dichroic reflector having no appreciable electromagnetic wave absorption factor; while exhibiting maximum transmission and/or reflection, that is, substantially, zero reflection at specified wave length range or plurality of ranges, and substantially total reflection at specified wave length range or plurality of ranges, with substantially total transmission at ranges of zero reflection.

Such dichroic reflector is made by coating a transparent substrate medium with alternate layers of compositions having different indices of refraction, that is compositions of multilayer configuration consisting of alternating layers of high and low refractive index materials.

The aforementioned transparent substrate consists of any of the family of commercially manufactured inorganic lanthanum borate glasses having a refractive indice about or above 1.6. Compositions for high refractive index layers can be formed from composite mixtures consisting of zinc sulphide, zinc oxide, lead molybdate, lead tungstate. Compositions for low refractive index layers can be formed from composite mixtures consisting of calcium fluoride, aluminum fluoride cryolite, magnesium fluoride, lithium fluoride or as a substituent the mineral Gearksutite, which is a natural calcium aluminum oxy-fluoride.

In reference to such layers of high and low indices of refraction, the thickness of each high refraction composition, for optimum transmission has been determined to be an optical thickness of one-quarter wavelength for the maximum wave length to be transmitted at the center of the principal transmission band, with an exception being for the high refractive layer that directly preceds supporting substrate, that layer being of an optical thickness of one-half wave length of the light that is to be selectively transmitted. The thickness of compositions to be formed for low refractive indices have been determined to be one-eighth wavelength for the maximum wavelength to be transmitted at the center of the principal transmission band of the light that is to be selectively transmitted. If multiple wavelength range or a plurality of ranges are to be transmitted and/or reflected, additional layers as defined above may be stacked.

Since such configuration as layered and stacked is preferably of rigid construction, and in addition to supporting substrate, an additional panel of glass or other rigid synthetic plastic material is applied to the top outer surface of such configuration. Naturally it is understood that such outer panels must be of optical clarity and transparent in the wavelength range of radiation to be transmitted. Such outer panels are nonhydroscopic; resistant to scratching or abrasion; and may be dyed or tinted.

Moreover, the range of the selective wavelength band is regulated by the optical thickness of each said layer with the exception being that optimum transmission/reflection is achieved by a layered group of three, that being a high refractive layer, a low refractive layer and a duplicate high refractive layer.

Such stacked components may be heated to lamination temperature, subjected to vacuum and pressure to produce a single unit structure. A standard laminating chamber is evacuated to a pressure of approximately 1 (one) millimeter of mercury and thereafter heated to temperatures from approximately 180° to 200° F. Upon reaching the desired temperature, pressure is applied to all exposed surfaces, including side edges, said pressure being approximately 200 lbs. per square inch. After 4 to 7 minutes, temperature is reduced and pressure released.

Such dichroic reflectors are sometimes termed interference filters and may be inserted so as to intersect radiation beams singly, in tandem or in cooperative team wherein the multiple, that is more than one such filter, may act as an assist to the primary filter in the art of separating wavelength bands or colors.

A specific object of this novel system is to provide a variable density filter and optical filtration system wherein optical densities of such filters vary in accord and response to photochromic and/or phototropic properties incorporated therein, such photochromic and/or phototropic properties responding to electromagnetic radiation in the visible and/or non-visible wavelength ranges.

Such variable density optical filters may consist of any number of the families of inorganic silicate based glass matrix; or inorganic lanthanum borate glass matrix; or inorganic metal oxides suspended in polyester binders. Glass compositions are processed in the conventional manufacturing practices as dictated by base type, such as chamber reduction for silicates and non-reduction for lanthanum borate. Lanthanum borate is preferable in that they exhibit increased radiation sensitivities, higher refractive indices which provide greater resolution than do lower index glasses.

Photochromic and/or phototropic properties incorporated into such glass compositions contain microcrystals of silver halides selected from the group consisting of silver chloride, silver bromide and silver iodide, and are incorporated within the aforementioned glass matrix in conventional glass-making practices of their type and kind.

In addition however, to the photochromic glass composition and in accord with this novel system and invention dyestuffs have been introduced. That is dyestuffs of a nature as to correspond to the color (wavelength) of the three ranges represented by what is known as primary colors e.g. yellow, magenta and cyan.

Those practiced in the art will recognize the foregoing as a variable density optical filter wherein optical densities are varied in accord to the intensity and wavelength (color) content thereon exposed. Moreover, when such filters are prepared in section, that is from 2 (two) pieces of density variable color filter glass, an electronically conductive interlayer material, transparent in nature is positioned between said glasses. The two said glass filters with the inserted interlayer may be laminated in the conventional manner to form a single structure. Electrical current may be alternating or direct. It has been determined that approximately one (1) milliamp per square inch from a twelve (12) volt direct current source is sufficient to activate the photochromic properties.

It is a specific object of this novel system to provide light sensitive emulsions of a nature so as to correspond to the color (wavelength) of the three ranges represented by what is known as primary colors, e.g. yellow, magneta or red, and cyan or blue, while not limited to such ranges (colors) for the purposes herein defined said ranges (colors) are identified. Such sensitivity shall encompass the visible wavelength range and shall extend from about 2950 A to, approximately, 5250 A for range one (1) or for blue or cyan; from 4750 A to 6250

A for range two (2) or for yellow; and, from 5750 A to 7250 A for range three (3) or for red or magenta.

Such light sensitive emulsions may be manufactured in the conventional film-making practices, and, while advantageous to the system, said system is not limited to their exclusive use in that any of the family of high quality panchromatic film may be utilized.

Substrate materials for such emulsions are preferably of stable base polyethylene ester, with dimension variants not to exceed 0.0020 to 0.0030 within a 24 inch span while under temperature variant of plus or minus 20°, and not to exceed 0.005 to 0.010 while under humidity variant of 20%. The grey scale, contrast range should be represented by a minimum of 15 to 20 steps of tonal range with maximum opacity for subsequent halftone dot transference or high intensity radiation source for subsequent imaging of photographic, lithographic or other image reproductive procedures.

It is a specific object of this novel system to provide a photographic means not only to color separate electromagnetic waves into three (or more) distinct wavelength ranges, but to all such ranges with photographic images therein, to selected light sensitive film emulsions contained within said photographic means, simultaneously.

The foregoing is accomplished by directing a polychromatic geometric image bearing light beam to a first dichroic reflector; said first dichroic reflector reflecting image bearing wavelengths of the first selected range to and upon the first photochromic variable density color filter and hence onto the first light sensitive film emulsion. Such image bearing light not so reflected is transmitted directly to a second dichroic reflector wherein the procedure as described is repeated for the second variable density filter, second film, etc., and, subsequently to a third dichroic reflector wherein the procedure as described is repeated for the third variable density filter, third film, etc.

The remaining light not so reflected is directed to a fourth light sensitive film emulsion and may be utilized as a complementary color such as black or other as desired.

OBJECTS OF THE INVENTION

An object of this invention is to provide a means and a method for securing a selective range of wave lengths of light without substantial loss of electromagnetic energy; another object of this invention is to provide a means and method for the simultaneous and, substantially, instantaneous and self-adjusting automatic separation of colors or of wave lengths; an additional object is to provide a photosensitive emulsion having a filter for absorbing selective wave lengths of light; another important object is to prepare a printing plate or a lithographic plate directly from a selected wave length band without the requirement of the intermediate steps utilizing standard film procedures; another object is to provide a means and a method for creation of a geometric image by means of electrical pulses where no geometric image is visible; an additional object is to provide a means and a method for converting a selective range of wave lengths to certain information such as analog information and digital information; another object is to provide a means and a method for converting a selective range of wave lengths to certain information and recording and storing said certain information; an additional object is to provide a means and a method for reducing the time to make color separations for reproduction purposes; another important object is to provide a means and a method for lessening the cost for making color separations for reproduction purposes; another object is to provide a means and a method for increasing the quality of color separations for reproduction purposes; an additional object is to provide a means and a method for making a color separation from a live subject and to eliminate an intermediate film transparency so as to achieve a better quality of a color separation at a less expense for reproduction purposes; another object is to provide a means and a method for an automatic self-adjusting variable density filter having photochromic properties or phototropic properties and also absorption properties and transmission properties; an additional object is to provide a photographic emulsion sensitive to a selected range of wave lengths for reproduction purposes; another important object is to provide a means and a method for separating wave lengths into selected ranges of wave lengths thereby lessening the need for the technical training of an operator of the means so that a novice may be used; an additional object is to provide a means and a method for, substantially, simultaneous activation of photosensitive emulsion; and, another object is to provide a means and a method for, substantially, simultaneous activation of variable density filters.

These and other important objects and advantages of the invention will be more particularly brought forth upon reference to the detailed description of the invention, the appended claims and the accompanying drawings.

THE DRAWINGS

In the drawings:

FIG. 1 is a fragmentary cross-sectional view of a dichroic reflector showing a substrate and a high refractive index layer, a low refractive index layer and a high refractive index layer;

FIG. 2 is a fragmentary cross-sectional view of a dichroic reflector showing three high refractive index layers and two low refractive index layers;

FIG. 3 is a fragmentary cross-sectional view showing a substrate and three high refractive index layers and two low refractive index layers;

FIG. 4 is a fragmentary cross-sectional view illustrating a frame for positioning two outer high refractive index substrates or protective members and three high refractive index layers and two low refractive index layers;

FIG. 5 is a fragmentary cross-sectional view illustrating two outer substrates and three inner high refractive index layers and two inner low refractive index layers;

FIG. 6 is a diagram of percent reflection versus wave length in Angstroms for the three selected wave length bands of primary colors when using the dichroic reflectors as illustrated in FIGS. 1–5;

FIG. 7 is a fragmentary cross-sectional view of one species of a variable density filter;

FIG. 8 is a fragmentary cross-sectional view of another species of a variable density filter and which variable density filter comprises three high refractive index layers and two low refractive index layers;

FIG. 9 is a fragmentary cross-sectional view illustrating two substrates of the variable density filter and an exciting means for exciting the photochromic materials or phototropic materials of the filter;

FIG. 10 is a fragmentary cross-sectional view illustrating a variable density filter having two outer substrates and three inner high refractive layers and two inner low refractive layers;

FIG. 11 is a fragmentary cross-sectional view illustrating a variable density filter having two outer substrates, three inner high refractive layers and two inner low refractive layers and an exciting means for exciting the photochromic materials or phototropic materials of the outer substrate;

FIG. 12 is a fragmentary cross-sectional view illustrating a variable density filter having two outer substrates, three inner high refractive layers and two inner low refractive layers, and an exciting means for exciting the photochromic materials or phototropic materials of the variable density filter;

FIG. 13 is a fragmentary cross-sectional view of a variable density filter comprising a substrate and two high refractive index layers and one low refractive index layer;

FIG. 14 is a diagram of a wave length range selectivity using a variable density filter as illustrated in the FIGS. 7–13;

FIG. 15 is a fragmentary cross-sectional view of an integral substrate and a photosensitive emulsion;

FIG. 16 is a fragmentary cross-sectional view of an integral substrate; photosensitive emulsion and a filter for absorbing wave lengths of a selected range;

FIG. 17 is a schematic illustration of an arrangement for diochroic reflectors and variable density filters for realizing selected ranges of desired wave lengths;

FIG. 24 is a schematic illustration of a lens and dichroic reflectors and photosensitive emulsions for separating wave lengths into selected ranges of desired wave lengths and recording the desired ranges of wave length on the photosensitive emulsions;

Figure 23:
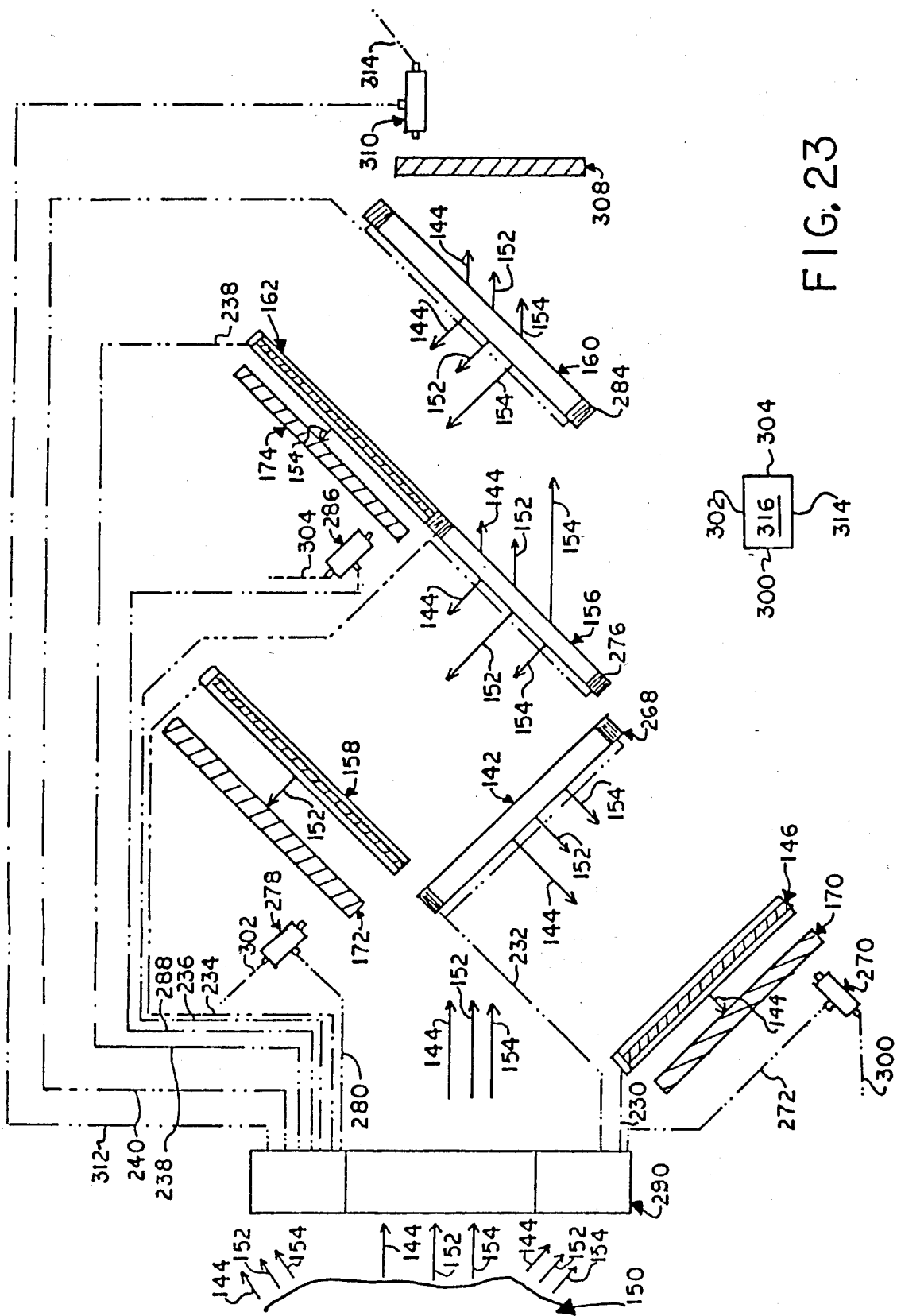
FIG. 23 is a schematic illustration of a combination of a selective wave length sensor and control and power source for the combination of the dichroic reflectors, the variable density filters, and either a recording means or a scanning means.
Figure 27:
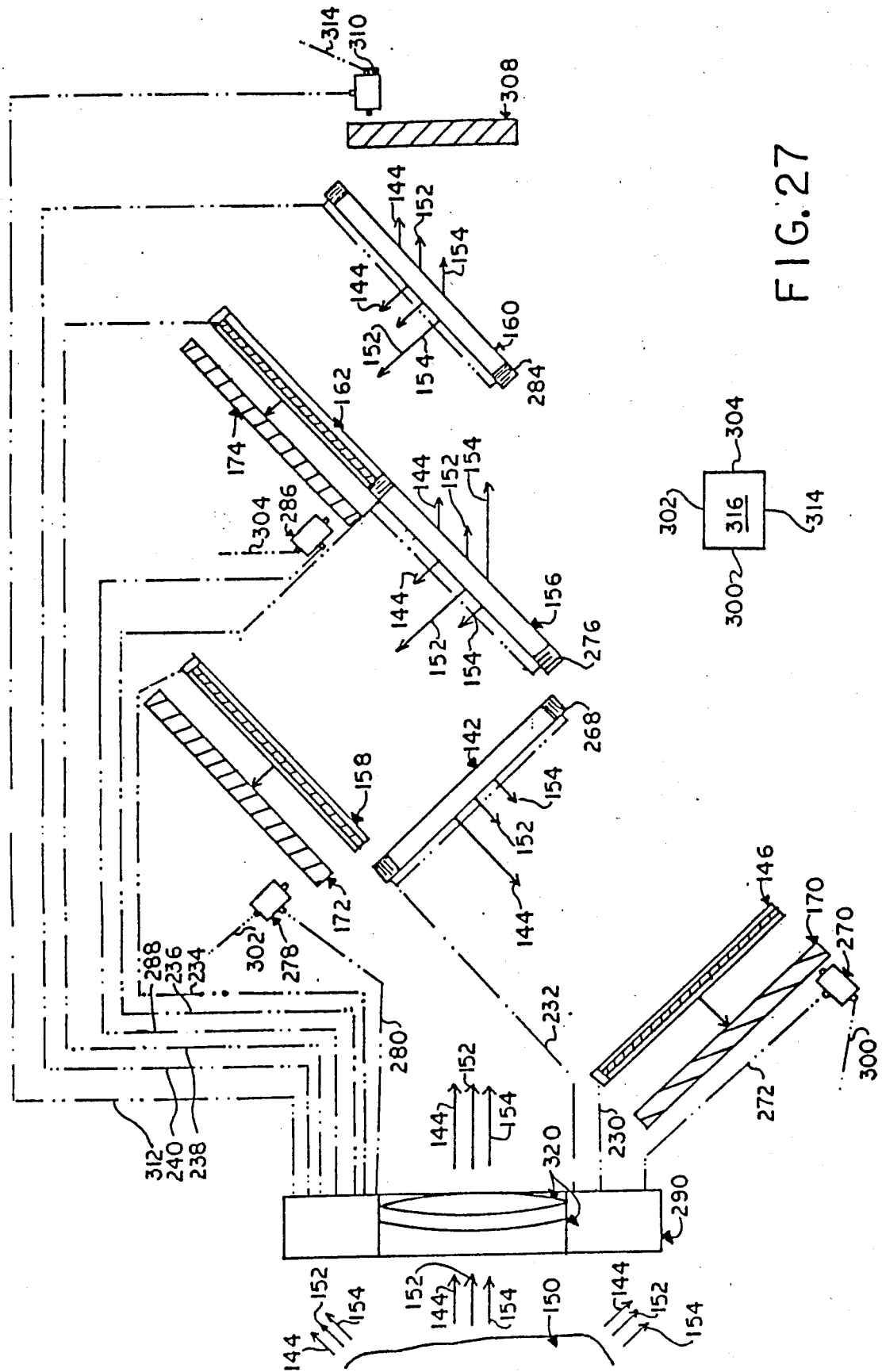
FIG. 27 is a schematic illustration of a lens, a combination of a selective wave length sensor and control and power source, dichroic reflectors, variable density filters, and a recording means or a scanning means.
Figure 28:
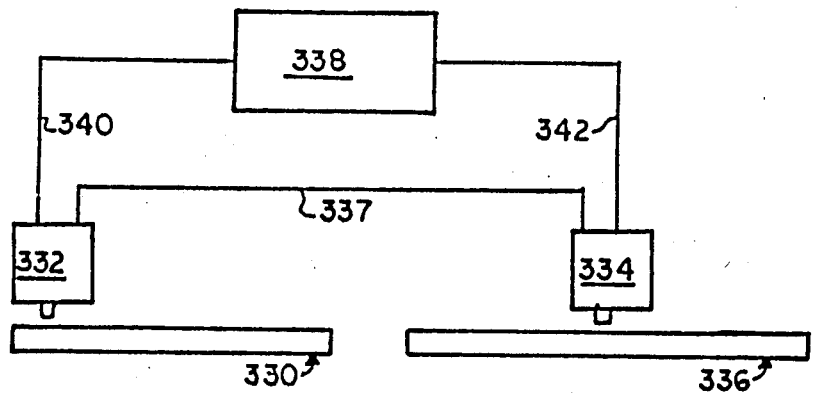
Figure 29:
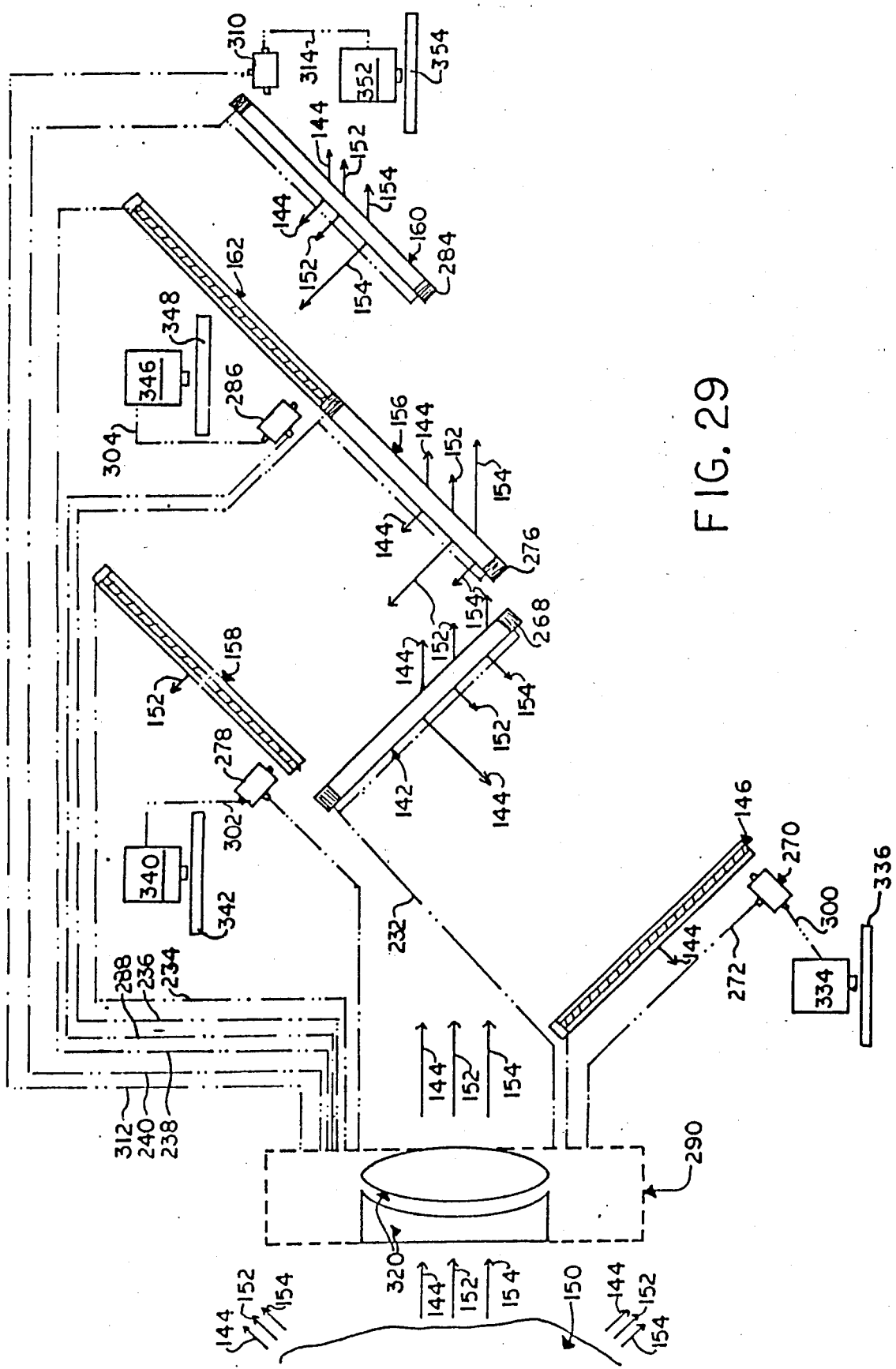

FIG. 28 is a schematic illustration of a scanning means for scanning recorded material and means for activating a photosensitive surface or for etching a material; and, FIG. 29 is a schematic illustration similar to FIGS. 23 and 27 showing a series of dichroic reflectors, variable density filters and a scanning means for scanning the geometric image from a variable density filter and for activating a photosensitive surface or for etching a material to make a printing plate.

Figure 30:
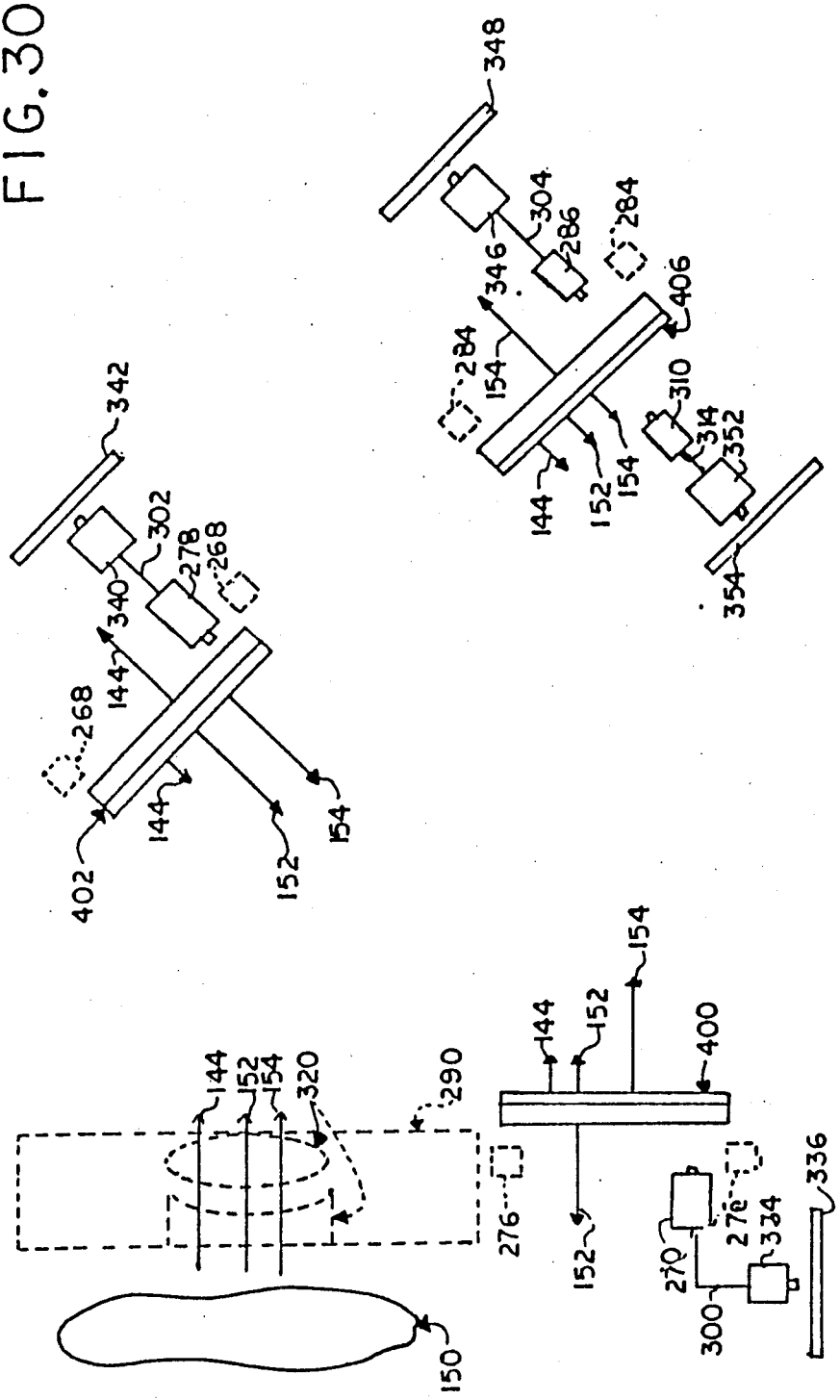

FIG. 30 is a schematic illustration of a system for separating light waves into a desired range or desired ranges of light waves and using variable density filters having reflective means or reflective properties, and also using scanning means for scanning the geometric images from the variable density filters and recording means connecting with the scanning means for recording the geometric images from the variable density filter such as by analogue information, digital information and on other forms of information such as on a photosensitive emulsion, paper tape or plastic tape or hollerith cards, or on other surfaces such as metal and the like.

FIG. 31 is similar to FIG. 17 and illustrates means for converting the information, in the form of electromagnetic radiation as light waves, into information which can be with a display.

Figure 32:
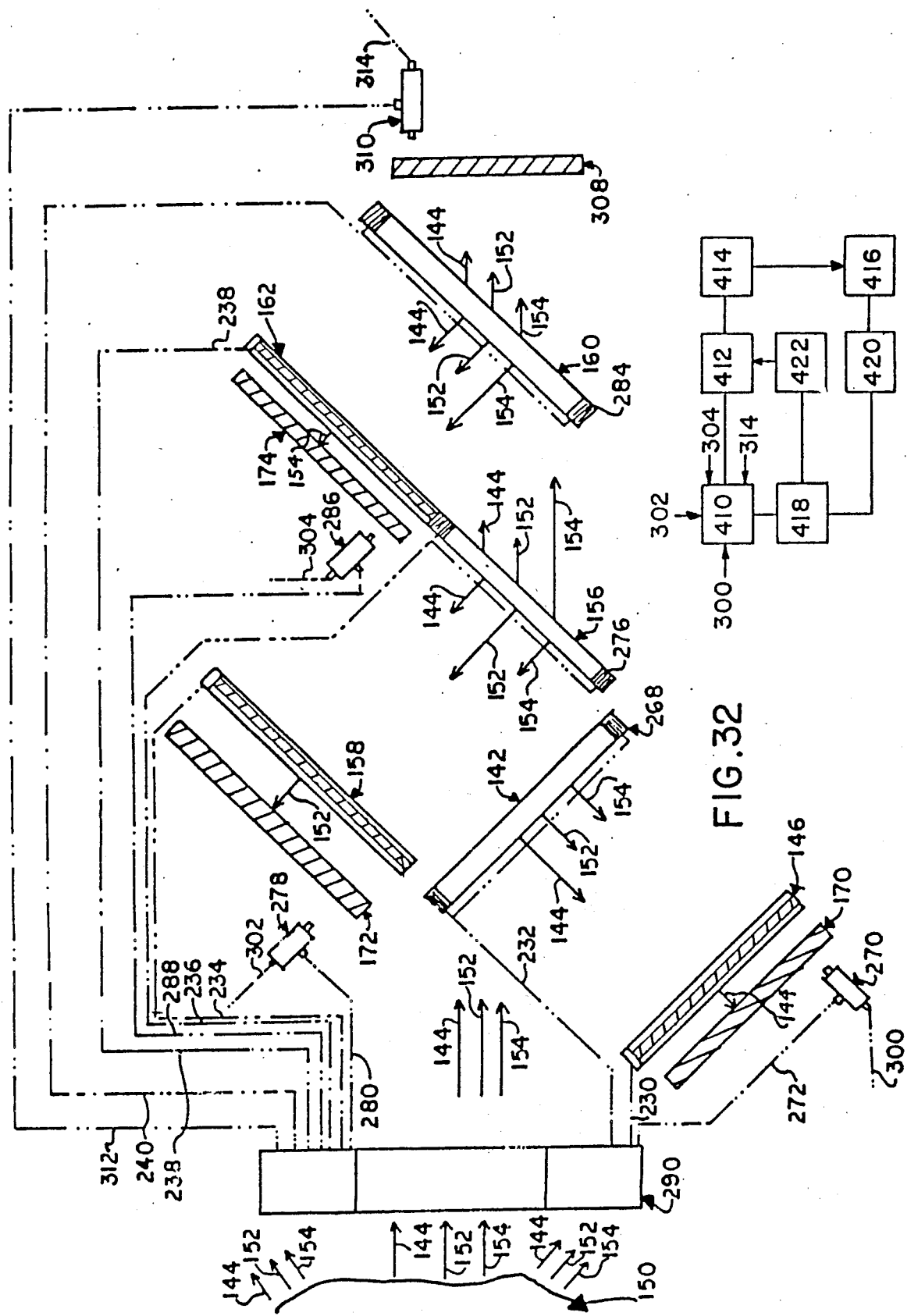

FIG. 32 is similar to FIG. 23 for converting the information into a form which can be used with a display.

Figure 33:
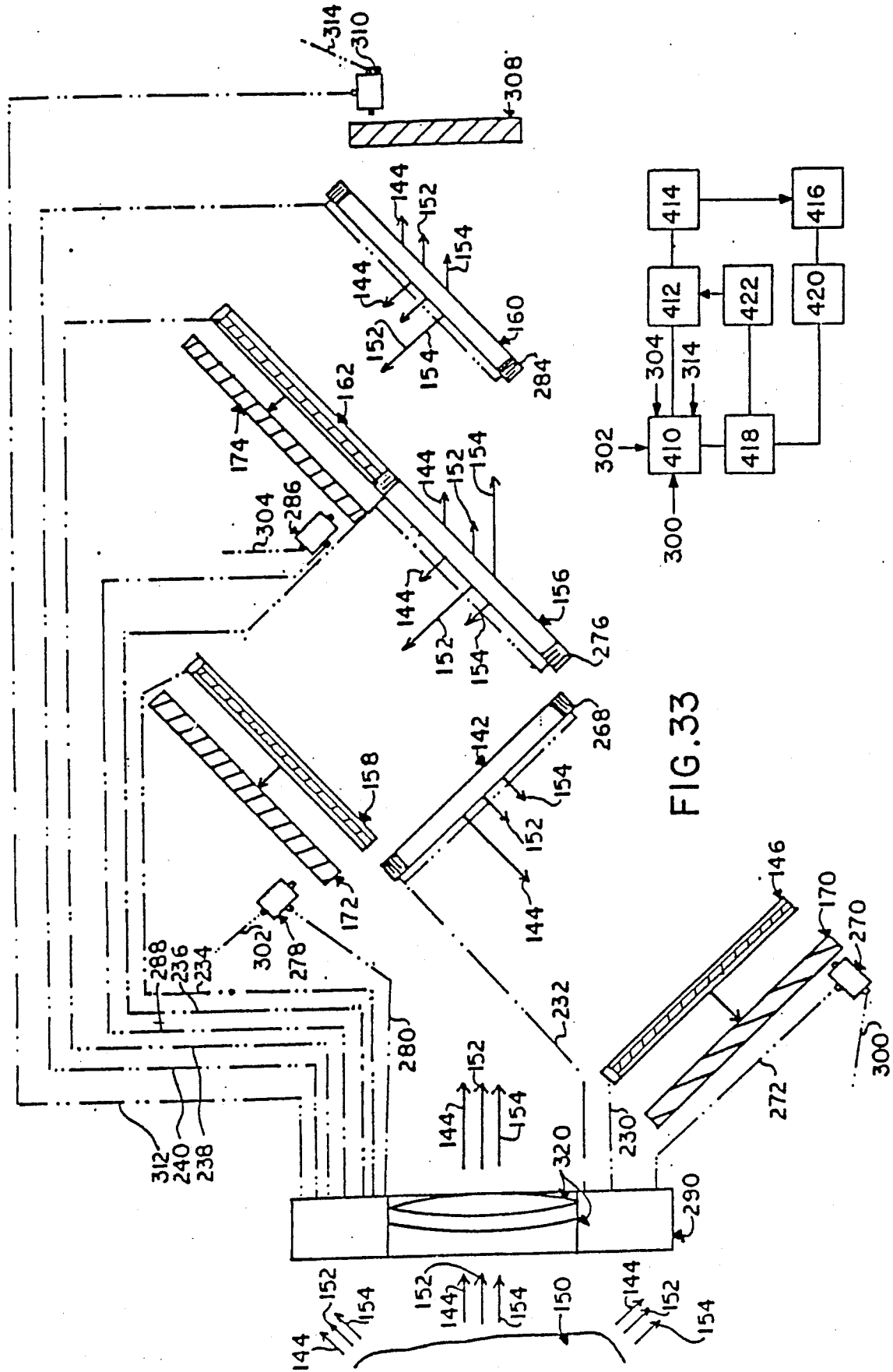

FIG. 33 is similar to FIG. 27 for converting the information into a form which can be used with a display.

Figure 34:
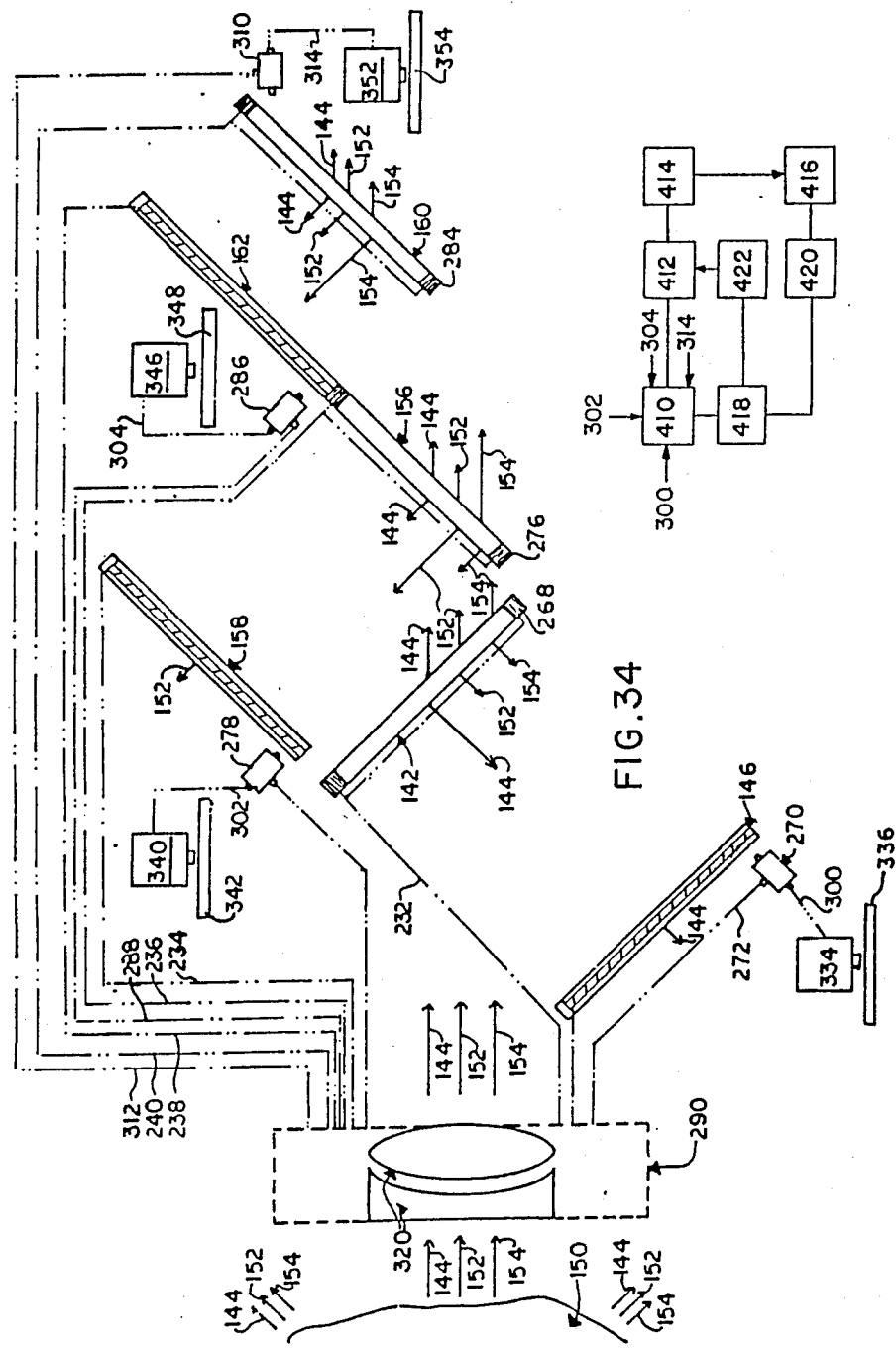

FIG. 34 is similar to FIG. 29 for converting the information into a form which can be used with a display.

Figure 35:
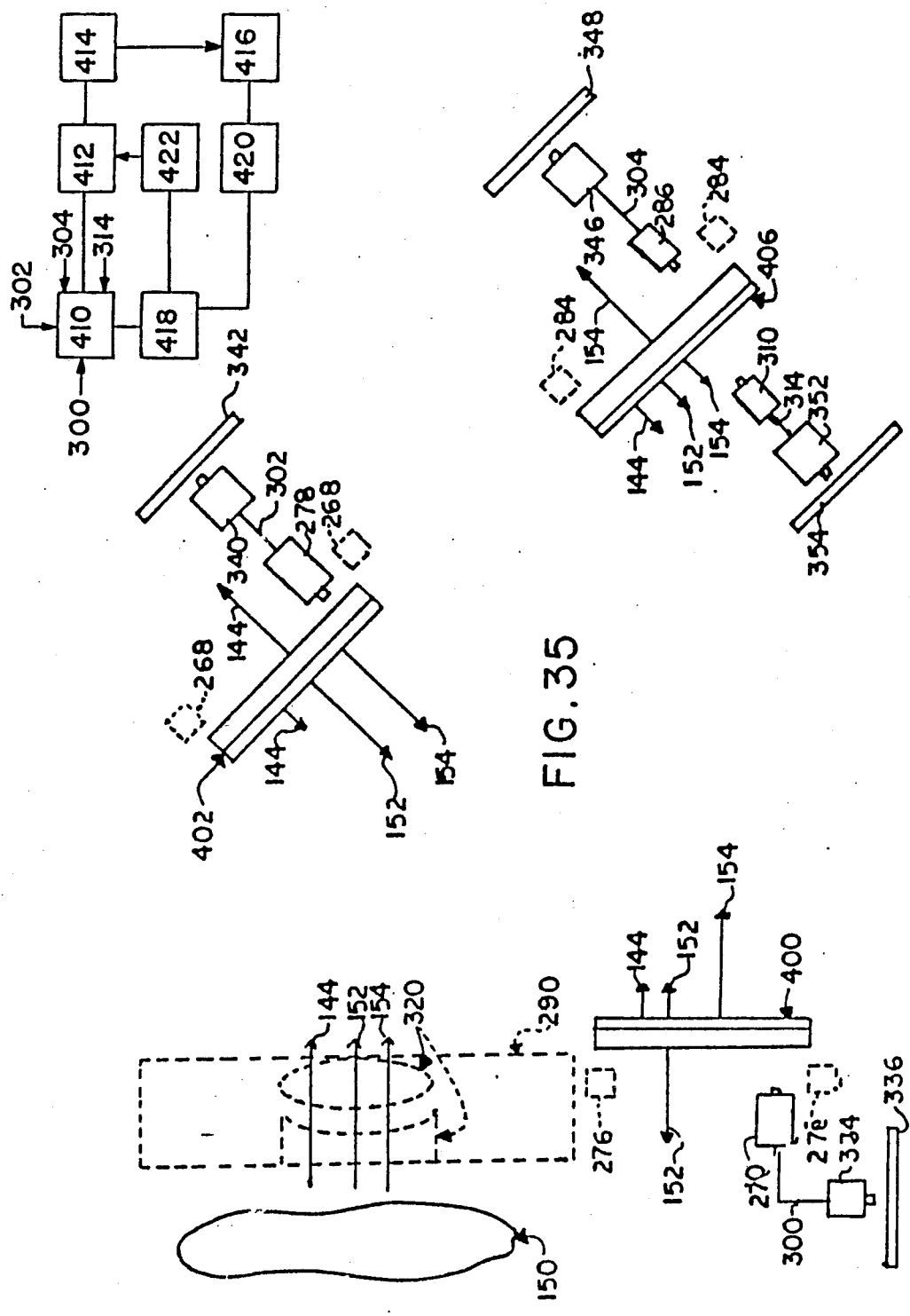

FIG. 35 is similar to FIG. 30 for converting the information into a form which can be used with a display.

SPECIFIC DESCRIPTION OF THE INVENTION

This invention is directed to the separation of colors into discrete ranges of colors. Then, if desirable, the discrete ranges can be combined to form new colors.

As is well known white light comprises all colors. There are three primary colors, blue, yellow and red. The colors, in the three primary colors, may be blended to form all colors and may be blended to form white light.

As is also well known light is composed of electro-magnetic radiation. The electro-magnetic radiation has a certain speed known as the speed of light or a speed of, approximately, $3.00 \times 10^8$ centimeters per second. The frequency of the electro-magnetic radiation determines the wave length of the electro-magnetic radiation, as expressed in the formula $$f\lambda = c$$

where
  f = frequency of electro-magnetic radiation
  $\lambda$ = wave length of electro-magnetic radiation
  c = speed of electro-magnetic radiation or light, $3.00 \times 10^8$ meters per second With the variation in the frequency of the electro-magnetic radiation there is a variation in the wave length of the electro-magnetic radiation. The various wave lengths of electro-magnetic radiation determine the color of the electro-magnetic radiation in the visible light range. The visible light range is, approximately, 4000 Angstroms to 7000 Angstroms where an Angstrom equals $10^{-8}$ centimeters. It is to be understood that the visible light range will vary with an individual. Some individuals may have a visible light range from approximately 3900 Angstroms to 7250 Angstroms while other individuals may have a visible light range much less than a span of 3000 A.

In this regard the wave length of blue light is in the range of, approximately, 4000 A to 5000 A. The wave length of yellow light is in the range of, approximately, 5000 A to 6000 A. The wave length of red light is in the range of approximately, 6000 A to 7000 A. In the area where blue light and yellow light converge there is no clear distinction, and in the area where yellow light and red light converge there is no clear distinction. In other words there is an overlapping of colors. A blue light may be in the range of about 3900 A to about 5250 A and the yellow light may be in the range of about 4750 A to about 6250 A. Also, a red light may be in the range of about 5750 A to about 7250 A. This leads to shades of blue or cyan color and to shades of yellow color and to shades of red or magenta color.

In the separating of the colors into discrete ranges I control the electro-magnetic wave lengths and separate the colors by reflective means or filtering means or, when a film means is used, with a film means or by combinations of the above means, where appropriate.

The reflective means has the ability to reflect electro-magnetic waves in a certain wave length range and to transmit electro-magnetic waves in another wave length or in other wave length ranges.

A reflective means may comprise a dichroic filter or a so called "interference filter". A dichroic filter comprises alternating high refractive index layers and low refractive index layers. For example, there may be a high refractive index layer, a low refractive index layer and then a high refractive layer. Or, for greater reflectivity there may be three high refractive index layers and two low refractive index layers or, four low refractive index layers. It has been found that by forming each of the high refractive index layers and each of the low refractive index layers with an optical thickness of one-quarter wave length to the maximum wave length to be reflected at the center of the principal reflectance band, viz., for blue at, approximately 4500 A and for yellow at about 5500 A and for red about 6500 A, optimum results are obtained. For quarter-wave low refractive index layers, the thickness can be determined by the following relationship:

$$t_L = \lambda_0/4n_L$$

where $t_L$ represents the thickness of the low index of refraction layers, $\lambda_0$ represents the wave length to be reflected at the center of the principal reflectance band, and $n_L$ represents the refractive index of the low refractive index layers.

Similarly, for quarter-wave high refractive index layers, the thickness can be determined by the following relationship:

$$t_h = \lambda_0/4n_h$$

there $t_h$ represents the thickness of the high refractive index layers and $n_h$ represents the index of refraction of the high refractive index layers.

The dichroic reflector or "interference filter" comprises the alternating layers of high refractive material and the low refractive material. In FIG. 1 there is illustrated a part of reflective means 50 comprising a substrate 52, a high refractive material 54, a low refractive material 56 and a high refractive material 56. It is seen that the low refractive material 56 is positioned between the high refractive material 54 and the high refractive material 54 or, to state it differently, there is a layer of a high refractive material 54, a layer of low refractive material 56, and a layer of a high refractive material 54.

In FIG. 2 there is illustrated a reflective means or reflector 60. The reflector 60 comprises a layer 54 of high refractive material, a layer 56 of low refractive material, a layer 54 of high refractive material, a layer 56 of low refractive material and a layer 54 of high refractive material. In FIG. 1 it is seen that there are three layers of refractive material and that in FIG. 2 there are five layers of refractive material. The more layers of refractive material, generally, the greater the selective reflective power of the reflector.

In FIG. 3 there is illustrated a five layer reflector, similar to the five layers of FIG. 2, and on a substrate. In FIG. 3 the reflector 62 comprises the high refractive index layers 54, three in all, and the low refractive index layers 56, two in number, positioned on a substrate 64.

In FIG. 4 there is illustrated a reflector 70 comprising outer protective shield 72 and three layers of high refractive material 54 and two interspersed layers of low refractive material 56. It is seen that between the shield 72 and the high refractive layers 54 that there is a void or a gas space 74. Also, there is a holding means or a frame 76 for positioning the shield 72 with respect to the high refractive layers and the low refractive layers. The void 74 or gas spaces 74 function as an insulator to lessen the changes in the reflective means 70 with changes of ambient temperature.

In FIG. 5 there is illustrated reflective means 80 comprising outside shield 72 and three layers of high refractive material 54 and two interspersed layers of the low refractive material 56. The reflector 80 is of a sandwich construction. The shield 72 may be considered substrate for the high and low refractive layers 54 and 56. The reflective means 80 is a laminate structure wherein the shield 72 and the high and low refractive layers 54 and 56 are laminated into one unit.

The high refractive index layers should have a thickness of approximately one-fourth the length of the mid range of the electro-magnetic waves to be reflected and the low refractive index layers 56 should have a thickness of one-eighth of the wave length of the mid range of the electro-magnetic radiation to be reflected. For cyan or blue light the mid range is, approximately, 4500 A. Therefore, the thickness of the high refractive index layer 54 should be about one-fourth of 4500 A or about 1125 A or a thickness of about $1.125 \times 10^{-5}$ centimeters, and the thickness of the low refractive layer should be about one-eighth of 4500 A or approximately, 560 A to 565 A in thickness or about 0.56 to $0.565 \times 10^{-5}$ centimeters. Likewise, for yellow light having a mid range of about 5500 A the thickness of the high refractive layer 54 should be about one-fourth of 5500 A or, approximately, 1375 A or $1.375 \times 10^{-5}$ centimeters, and the thickness of the low refractive layer 56 should be about one-eighth of 5500 A or about 685 A to 690 A or 0.685 to $0.690 \times 10^{-5}$ centimeters. Similarly, for red light having a mid range of about 6500 A the thickness of the high refractive layer 54 should be one-fourth of 6500 A or 1625 A or $1.625 \times 10^{-5}$ centimeters and the thickness of the low refractive layer 56 should be one-eighth of 6500 A or 810 A to 815 A or 0.81 to 0.815×10⁻⁵ centimeters.

In FIG. 6 there is illustrated the percent reflection of light from a reflector in terms of the wave length of a light. As previously stated, for blue light in the range of about 4000 A to 5000 A and with a mid range of 4500 A the reflective power of the reflectors 60, 62, 70 and 80 is, approximately, 95 to 98 percent. It is also seen that about 95 to 98 percent of the wavelengths in the range of 4500 A will be reflected and substantially all of the wave lengths of light for yellow and red will be transmitted.

Likewise, for yellow light having a mid range of 5500 A, it is seen that there is, approximately, 95 to 98 percent reflection of light waves of 5500 A in length and transmission of the majority of the blue light waves in the 4000 A to 5000 A range and the red light waves in the 6000 A to 7000 A range. Also, for red light having a mid range of 6500 A there is approximately 95 to 98 percent reflectivity and substantial transmission of all the blue and yellow light waves. In fact, for red having a mid range of 6500 A, there is transmission of all the blue light waves and substantial transmission of all the yellow light waves. FIG. 6 further shows that as the wave length of the light waves deviates from the mid range that there is a decrease in the reflectivity of the light waves. For example, for blue light with a mid range of 4500 A it is seen that at about 3900 A there is only a small percentage of reflectivity and likewise for 5200 A wave length light waves there is only a small percentage of reflectivity of the light. This is also true for yellow light having a mid range of 5500 A and where light of 4900 A or 5000 A the degree of reflectivity is considerably less than 100 percent and also for light waves of 6000 A or 6200 A the degree of reflectivity is quite low. The same can be said for red light having a mid range of 6500 A wherein for light having a wave length of 5900 A or 6000 A the degree of reflectivity is, relatively, low and likewise, for light waves of 7000 to 7200 A the degree of reflectivity is relatively low. As the light waves deviate in length from the mid range the degree of reflectivity decreases.

In FIGS. 1 through 6 it is seen that there is presented a dichroic reflector or "interference filter" which is useful in selecting discrete ranges of light. This is diagrammatically illustrated in FIG. 6. Of importance is the fact that with the use of a dichroic filter there is the conservation of light or the conservation of light energy in that light is not absorbed but is separated by reflection and tranmission. As will be more, clearly, brought forth in a latter part of this discussion it will be seen that by conserving the light that the light can be reflected and transmitted into discrete ranges as desired. In FIG. 6 it is seen that the discrete ranges are in the blue, yellow and red ranges wherein the mid range is the desired range. If, it is desirable for blue light there may be a compromise to two mid ranges of 4300 A and 4700 A wherein there are two reflective means, also for yellow light there may be two mid ranges of 5300 A and, likewise, for red light there may be two ranges of 6300 A and 5700 A. In certain instances it may be desirable to have this greater selectivity of discrete ranges.

In regard to dichroic reflectors or "interference filters", as above described, reference is made to two interesting patents which teach of such a reflector and such a filter. These two patents are Dimmick, U.S. Pat. No. 2,379,790, issuing date of July 3, 1945 and Edwards, U.S. Pat. No. 3,630,809, issuing date of Dec. 28, 1971. Dimmick teaches of a high refractive index layer having a thickness equal to one-half of the desired wave length and a low refractive index layer having a thickness equal to one-quarter of the desired wave length of the light reflected. Edwards teaches of a high refractive index layer having a thickness equal to one-quarter of the desired wave length and a low refractive index layer having a thickness equal to one-eighth of the desired wave length of the light to be reflected. Dimmick and Edwards both teach of alternating layers of a high refractive index layer and a low refractive index layer to achieve selective reflectance of the desired wave length and transmission of other wave lengths.

The substrates 52, 64 and 72 are, preferably, of a high refractive index material having a refractive index in the range of about 1.55 to 1.65. A suitable substrate may be of a family of commercially manufactured inorganic lanthanum borate glasses having a refractive indices of about or above 1.6. There are other substrates having a refractive indices of about 1.55. Such a substrate is, preferable, because of the high refractive index. The high refractive index layer 54 can be formed of various materials such as composite mixtures consisting of zinc sulfite, zinc oxide, lead molybdate, lead tungstate and the like. The low refractive index layers 56 can be formed composite mixtures consisting of calcium fluoride, aluminum fluoride, cryolite, magnesium fluoride, lithium fluoride or the mineral Gearksutite which is a naturally ocurring calcium aluminum oxy fluoride. Although I, previously, stated that it is desirable to have a substrate with an index of refraction in the range of 1.55 to 1.65 it is to be understood that a substrate with a lower index of refraction can be used. However, a substrate with a high index of refraction is preferable to a substrate with a low index of refraction. It is possible to use a boral-silicate glass having an index of refraction of 1.47 or to use a fused silica clear glass having a refractive index of 1.459 as a substrate. Further, additional substrates can be a fused quartz substrate having an index of refraction in the range of about 1.47; a silicate crown glass having an index refraction in the range of about 1.51 to 1.52; a substrate of quartz having an index refraction of about 1.55; a substrate of borate flint glass having an index refraction in the range of about 1.58 to 1.59; and a silicate flint glass as a substrate having an index refraction in the range of about 1.61 to 1.66.

In the preceding section I have described a dichroic reflector or an "interference filter" wherein there is, substantially, no loss of light energy or electromagnetic radiation energy. With a dichroic reflector, substantially, all of the incident light is reflected from the reflector or transmitted through the reflector. Naturally, there is a small amount of loss of light energy but for all practical purposes the light energy is reflected by the dichroic reflector or transmitted through the dichroic reflector. From a selective dichroic reflector, the reader's attention is directed to FIG. 6, and, for example, for a blue light in the range of about 3900 A to about 5250 A it is seen that the reflected light spans this range so that some of the ultra-violet light rays are in the blue range as well as some of the yellow light rays. The dichroic reflector, as illustrated in FIG. 6, does not have a complete one-hundred percent reflectance of the desired wave length light waves but does have some adulteration. These comments are also applicable for yellow light in the range of about 4750 A to about 6250 A wherein the shorter wave length the yellow overlaps into the blue range and on the longer wave length the yellow overlaps into the red range. Similarly, for red light in the range of about 5750 A to about 7250 A the red light on the shorter wave lengths overlaps into the yellow range and on the longer wave lengths overlaps into the infra-red range.

Because of this characteristic of the dichroic reflector of not reflecting, completely, the desired wave length light wave, I, at times, use an absorption filter to remove the undesirable overlapping wave length light waves. With the aid of an absorption filter, I am able to achieve a more pure color. The absorption filter I use comprises a carrier for an absorbant material and said carrier is also a carrier for a photochromic material. A photochromic or phototropic material is one which has the ability to alter optical density when irradiated with light in a particular wave length region and whose optical density decreases when the exciting radiation is removed. More particularly, substances or materials which change their transmission or reflectance upon being subjected to ultraviolet or visible irradiation or infra-red irradiation and, subsequently revert to their original state upon subjection thereof to a different wave length of irradiation, or removal of the initial ultra-violet source. The material may comprise a glass or a plastic such as a polyester resin. The photochromic materials are mixtures of inorganic metal oxides such as $TiO_2$ doped with $Fe_2O_3$, FeO, $Cr_2O_3$, CuO, NiO, $MnO_2$, or $Mn_2O_3$; $Nb_2O_5$ doped with $Fe_2O_3$, FeO, $Cr_2O_3$, CuO, $V_2O_5$, $MnO_2$ or $Mn_2O_3$; $Al_2O_3$ doped with $Cr_2O_3$ or $V_2O_5$; ZnO doped with CuO or $V_2O_5$; $SnO_2$ doped with CuO; or $ZrO_2$ doped with CuO or NiO. Or, there may be a glass such lanthanum borate glass having a high refractive index doped in weight percent on the oxide basis as calculated from the batch, selected from the group consisting of 0–40% $Ta_2O_5$, 0–40% $Nb_2O_5$, 0–45% $ThO_2$, 0–30% $Al_2O_3$, 0–15% $TiO_2$, 0–15% $ZrO_2$, and 0–30% RO wherein RO consists of one or more of the bivalent metal oxides from the group consisting of ZnO, CdO, CaO, SnO, BaO, MgO and PbO. The silver halides such as silver chloride and/or silver bromide and/or silver iodide will exhibit some photochromic behaviour with lanthanum borate glasses and the various mixtures above described. The silver halides are some microscopic crystals dispersed in a glass matrix. These submicroscopic crystals of silver halide increase in optical density when exposed to ultra-violet radiation and return to their original state when the ultra-violet radiation is removed.

I incorporate, by reference, where appropriate, the teachings of U.S. Pat. No. 3,208,860, No. 3,317,321, issuing date of May 2, 1967; No. 3,278,319, issuing date of Oct. 11, 1966; No. 3,255,026, issuing date of June 7, 1966; and No. 3,703,388, issuing date of Nov. 21, 1972; in regard to photochromic or phototropic properties of various materials using a glass or a plastic as the carrier for the phototropic or photochromic material.

In FIGS. 7 through 13 there is illustrated a number of variable density filters comprising a light absorbent material or dyestuff and also a photochromic material or a phototropic material. Further, in some of these variable density filters there is included a reflector. In other words, the variable density filter has the ability to, simultaneously, selectively reflect waves of a first wave length, to, selectively, transmit waves of a second wave length, and to absorb waves of the first wave length. By way of example, the variable density filter comprising a dichroic reflector, a light absorbent material or dyestuff, and a photochromic material or phototropic material, has the ability to transmit yellow and also has the ability to reflect red and blue and to absorb red and blue. Similarly, this example can be used for transmitting blue and reflecting and absorbing yellow and red or for transmitting red and reflecting and absorbing blue and yellow.

In FIG. 7 there is illustrated a variable density filter 90 comprising a carrier for light absorbent material or dyestuff and also a carrier for photochromic material or phototropic material. As previously stated, the carrier may be a high refractive index glass or may be a plastic such as a polyester resin. The appropriate doping materials have been stated and also have been referred to in the cited patents, and are incorporated by reference where appropriate. The variable density filter 90 upon being irradiated with ultra-violet light or visible light or other electromagnetic waves will increase in optical density so as to increase the light absorption ability of the incorporated dyestuff.

In FIG. 8 there is illustrated a combination of a variable density filter having dichroic reflective ability, photochromic or phototropic properties and a light absorbent material or dyestuff. In FIG. 8 this variable density filter is referred to by reference numeral 92 and comprises the high refractive index layers 94 and the low refractive index layers 96. Again, in FIG. 8 the high refractive index layers 94 may have a thickness equal to one-half the desired wave length or one-quarter the desired wave length and the low refractive index layers may have a thickness of one-quarter the desired wave length or one-eighth the desired wave length, as previously explained with reference to the patents to Dimmick and Edwards. Also, the dyestuffs and the photochromic materials may be evenly dispersed in the high refractive index layers 94 and in the low refractive index layers 96; or, may be dispersed, only, in the high refractive index layers 94, or, only, in the low index refractive layers 96; or, the high refractive index layers 94 may comprise a different concentration of dyestuffs and photochromic materials than the low refractive index layers 96; or, the dyestuffs may be in the high refractive index layers 94 and the photochromic materials in the low refractive index layers 96 or, vice versa. It is to be realized that the distribution of the dyestuffs and the photochromic materials in the layers 94 and 96 may be in many combinations. In other words, the concentration of the dyestuffs and the photochromic materials in the layers 94 and 96 may be variable to correspond to the selective wave lengths to be reflected and absorbed and also to the selective wave lengths to be transmitted.

In FIG. 9 there is illustrated a variable density filter 100 comprising two variable density filters 90, see FIG. 7, and electro-conductive inner layer 102 connecting to an electrode 104. The electro-conducting layer 102 may be one of many materials such as a composition of matter comprising polyethylene glycol, lead acetate, polyvinylbutyrial and hydroquinone. The inner layer 102 should be transparent to allow light to pass through it and also should be electrically conductive so that with the application of electricity there is resistance to the passage of electricity which heats the inner layer and also heats the two variable density filters 90. Further, the inner layer 102 should have no absorption factor to light waves in the visible light spectrum. Again, the variable density filters 90 comprise light absorption material or dyestuffs and also photochromic material or phototropic material as previously explained with respect to the explanation of FIG. 7. Also, the variable density filters 90 may comprise different concentrations of the light absorption material and the photochromic materials for different absorption properties. In fact, one of the variable density filters 90 may contain a light absorption material and the other variable density filter 90 may contain a photochromic material.

In FIG. 10 there is illustrated a sandwich or a layer construction variable density filter 110 comprising the variable density filters 90 on the outside, see the explanation for FIG. 7, and the high refractive index layers 94 interspersed by the low refractive index layers 96, as, previously explained, with respect to FIG. 8.

In FIG. 11 there is illustrated a variable density filter 114 comprising the features of FIGS. 9 and 10 wherein there is the variable density filters 90 on the outside, the high refractive index layers 94 and the low refractive index layers 96. Between the variable density filters 90 and the outer high refractive index layers 94 there is an interlayer 102, see the explanation for filter 100 of FIG. 9, and an electrode 116. The interlayer 102 can be heated to vary the photochromic properties of the variable density filters 90 or the photochromic properties of the appropriate layers 94 and 96. Although, the placing of the dyestuffs and the photochromic materials has been previously explained with respect to FIGS. 8 and 9 by way of repetition it will be stated that the dyestuffs may be in the variable density filters 90 while the photochromic materials may be in the layers 94 or in the layers 96 or in the layers 94 and 96 or, conversely, the photochromic materials may be in the variable density filters 90 while the dyestuffs may be in the layers 94 or the layer 96 or the layers 94 and 96 or, again, the dyestuffs and the photochromic materials may be in the variable density filters 90 and the layers 94 and 96.

In FIG. 12 there is illustrated a variable density filter 120 similar to the filter 110 but comprising busbars 122 and 124 on each side of the sandwich construction so as to utilize the dyestuffs and the photochromic materials for conducting electricity in the appropriate materials such as the variable density filter 90 and the high refractive index layers 94 and the low refractive index layers 96. In other words, by conducting electricity through the materials of the variable density filter it is possible to vary the photochromic or phototropic properties of the variable density filter.

In FIG. 13 there is illustrated a variable density filter 126 comprising the variable density filter 90 and a first high refractive index layer 94, a first low refractive index layer 96 and a second high refractive index layer 94. The high refractive index layer 94 may have a thickness equal to one-half of the desired wave length and the low refractive index layer may have a thickness equal to one-fourth of the desired wave length or the high refractive index layer 94 may have a thickness equal to one-fourth of the desired wave length and the low refractive index layer 96 may have a thickness equal to one-eighth of the desired wave length. From the preceding description of the variable density filter it is seen that certain of the variable density filters there is a carrier for light absorption material or dyestuffs and also for the photochromic materials or phototropic materials. This is particularly true with respect to the variable density filter 90 in FIG. 7, the variable density filter 100 of FIG. 9, and variable density filter 110 of FIG. 10, the variable density filter 114 of FIG. 11, the variable density filter 120 of FIG. 14 and the variable density filter 126 of FIG. 13. The carrier, as previously explained at the start of the description of the variable density filter, may be a glass such as a high refractive index glass like lanthanum borate glass or maybe a plastic such as polyester resin. The carrier is doped with appropriate materials for light absorption such as cupric sulfact for blue, cobalt chloride for red property and ferric chloride for green-yellow property. The photochromic material or the phototropic material may be a silver halide, submicroscopic crystals in the carrier or in the matrix and such crystals may be silver chloride or silver bromide or silver iodide, for example. Further, as previously explained with reference to U.S. Pat. No 3,317,321 the photochromic or phototropic materials may be one of many such as titanium dioxide doped with ferric oxide or nubidium pentaoxide doped with ferric oxide or aluminum oxide doped with chromic oxide or zinc oxide doped with cupric oxide, to name a few. Also, the variable density filter may have reflective capabilities such as the variable density filter 92 of FIG. 8, the variable density filter 110 of FIG. 10, the variable density filter 114 of FIG. 11, the variable density filter 120 of FIG. 12, and the variable density filter 126 of FIG. 13. With the reflective properties, as previously stated, the variable density filter has the ability to, selectively, reflect and absorb light waves of a first wave length and to, selectively transmit light waves of the second wave length.

In regard to color absorption and standards for color absorption reference is made to the United States Department of Commerce, National Bureau of Standards, NBS Monograph 104, entitled "Colorimetry", issued Jan. 1968, page 25 wherein it is stated:

"The Arny solutions consist of groups of solutions whose concentrations are adjusted to produce the color match. The required concentrations are the specifications of the color. The most used group is a triad consisting of half-normal aqueous solutions of cobalt chloride (red), ferric chloride (yellow), and copper sulfate (blue) in 1 percent hydrochloric acid. This group produces all colors except deep blue and deep red; it is supplemented by a triad of ammoniated aqueous solutions of potassium permanganate and potassium dichromate . . . Mellon and Martin . . . have reported the spectral transmittances for a number of solutions for colorimetric standards, including the Arny solutions at three or four concentrations, each for the spectral range 440 to 700 nm . . . "

From this National Bureau of Standards publication it is seen that the absorption filter may comprise cobalt chloride for red, ferric chloride for yellow, copper sulfate for blue, and where it is desirable potassium permanganate for deep blue and potassium dichromate for deep red.

In FIG. 14 there is illustrated the wave length curves and the selective wave length band for blue, yellow and red. In FIG. 14 it is seen that substantially all of the blue color is in the 4000 A to 5000 A range, substantially, all of the yellow color is in the 5000 A to 6000 A range; and, substantially, all of the red color is the 6000 A to the 7000 A range. The wave lengths in the FIG. 14 are a result of the variable density filter wherein the desired selective wave lengths are transmitted through the filter and the other wave lengths are absorbed by the filter and/or reflected by the filter, depending upon the appropriate filter. In FIG. 6 the curves for the blue, yellow and red colors are produced by a reflector and which reflector, by way of recall, reflects substantially all of a certain band of wave lengths and transmits other wave lengths. A comparison of FIGS. 6 and 14, graphically, illustrates the selective features of the variable density filter. Another way of expressing this is that by a comparison of FIGS. 6 and 14 it is seen that in FIG. 14 the variable density filter has the ability to have a more selective band width for the wave lengths. In other words, there can be a more sharp differentiation between a red and a yellow and between a yellow and a blue. With the variable density filter and the photochromic property or the phototropic property of the variable density filter and also because of the ability to vary the optical density of the variable density filter it is possible to absorb those wave lengths of light waves which are outside of that, relatively, narrow band width. The variable density filter transmits those wave lengths in that, relatively, selective narrow band width. The variable density filter with its photochromic or phototropic properties, upon excitation, increases in optical density to increase the absorption power of the dyestuffs in the variable density filter. As, previously, stated in the forepart of this description it was brought forth that an object of this invention was to achieve a purity of color. In other words, an object of this invention is to achieve a selective band width of color such as is illustrated by the graphs or curves of FIG. 14 wherein the blue color is, for practical purposes, separated from the yellow color and also from the red color; the yellow color, for practical purposes, is separated from the blue color and the red color; and, likewise, for practical purposes, the red color is separated from the blue color and the yellow color. In other words the variable density filter of filters as described make it possible to, substantially, realize a purity of color which is desirable in color separation processes.

With the variable density filter it is possible to narrow the selective band width or to broaden the selective band width. With a variation in the optical density of the variable density filter it is possible to broaden and, also to narrow the selected band width of the various colors. By way of example, it is possible when appropriate, by judicious use of the optical density of appropriate variable density filters to narrow the band width for the blue color range while broadening the band width for the yellow color range and maintaining the band width, as desired for the red color range. Such an example can be expanded to state that it is possible to narrow the band width of the yellow color range and to broaden the band width of the blue color range and for the red color range or, to narrow the band width for the blue color range and the red color range. Also, it is possible, with the control of the optical density, to broaden the band width of the red color range and narrow the band width of the yellow color range or to narrow the band width of the red color range and to broaden the band width of the yellow color range while maintaining the blue color range as desired. From these examples it is seen that by judicious use of the optical density of the variable density filter the band width range of the selected wave lengths, or colors, can be controlled to be narrow or wide or normal in various combinations for red, yellow and blue. It is to be understood that by narrowing all of the color ranges for the red, yellow and blue that the respective colors would be, necessarily, restricted while if the other extreme is approached wherein the band width ranges for the blue, yellow and red are broad then there results impure colors and a mixture of the various colors. To repeat, one of the primary objects of this invention is to realize a selective band width range with only a minimum of mixing of the colors and yet which band width range is sufficiently broad to include all of the necessary wave lengths in its range for the blue color, for the yellow color and for the red color.

In FIG. 15 there is illustrated a film 130 comprising a substrate 132 and an emulsion 134. The emulsion 134 may be activated by light waves of a certain wave length such as light waves of a blue wave length or light waves of a yellow wave length or light waves of a red wave length. In other words, the emulsion 134 is selective with respect to the light waves which activate it.

In FIG. 16 there is illustrated a film 136 comprising a substrate 138, an emulsion 140 and a filter 142. The filter 142 may be an emulsion which absorbs light waves of a certain wave length. Also, the emulsion 140 may be activated by light waves of all wave lengths or may be activated by light waves of a certain wave length. In other words, in FIG. 16, there is illustrated a film 136 which has an integral filter for absorbing light waves of a certain wave length and for transmitting light waves of a selected wave length to activate the emulsion 140.

It is to be understood that the emulsion 134 and 140 may be of a panchromatic type emulsion which are activated by light waves of all wave lengths, at least, in the visible spectrum.

It is to be realized that the emulsions 134 and 140 may comprise a silver halide such as silver chloride, silver bromide and silver iodide, as is common to many emulsions, and in addition may comprise a dyestuff which, upon being activated by light, changes its form. An example of such a dyestuff or dye is U.S. Pat. No. 3,275,442, issuing date of Sept. 27, 1966 to Hans Kosendranius. This is of value in that for the emulsions 134 and 140, which are activated by light of a selective wave length or a selective wave length range as a dyestuff may be used in place of a silver halide. For example, the dyestuffs are compositions or materials which are pellucid, transparent or translucent, in the absence of light of certain wave lengths. Upon exposure of a selective wave length or wave length range the pellucid materials or dyestuffs are irreversibly converted with a high quantum efficiency to compositions of increased optical intensity, including compositions which are, substantially, opaque to visible light. In other words, in certain instances these dyestuffs are converted, when radiated with electromagnetic waves of a selective wave length range, to opaque material or are converted to the opaque form.

In FIG. 17 there is illustrated a system comprising reflectors and filters for producing a, substantially, pure selected range of wave lengths of electromagnetic radiation or light. There is a first reflector 142 which reflects a first selected range of wave lengths and transmits other wave lengths. For ease of illustration, but not to limit the invention, it will be stated that reflector 142 reflects a majority of wave lengths in the blue light range or having a wave length of approximately 4000 A to 5000 A and identified by reference numeral 144. The reflector 142 reflects the light waves to variable density filter 146. The variable density filter 146 will transmit substantially all of the light waves 144 and absorb the other light waves. More particularly, it is seen in FIG. 17 that there is a geometric image 150. The light waves from the geometric image 150 comprise those waves 144 in the blue region, and by way of illustration, waves 152 in the yellow region or in the range of about 5000 A to 6000 A and those light waves 154 in the red range or in the range of about 6000 A to 7000 A. The light waves 144, 152 and 154 strike the reflector 142 and substantially all of the light waves 144 are reflected to the filter 146, as previously explained and a very small percentage of the light waves 152 and 154 are directed to the filter 146. The filter 146 absorbs the light waves 152 and 154 and, may, reflect the light waves 152 and 154 depending upon the variable density filter 146.

The reflector 14 transmits a small percentage of the light waves 144 and transmits substantially all of the light waves 152 and 154. The light waves strike a reflector 156 and which reflector 156 reflects, substantially, all of the light waves 152 in the yellow range, also reflects a small percentage of the light waves 144 and 154 toward the filter 158. The filter 158 is a variable density filter which, selectively, transmits light waves 152 in the yellow range and absorbs and/or reflects and absorbs light waves 144 and 154 in the blue and red ranges.

From the reflector 156, substantially, all of the light waves 154 in the red range are transmitted and a small percentage of the light waves 144 and 152 are transmitted to the reflector 160. The reflector 160 reflects substantially all of the light waves 154 in the red range and reflects only a small percentage of the light waves 144 and 152 in the blue and yellow ranges to the filter 162. The filter 162 absorbs and/or absorbs and reflects the light waves 144 and 154 and transmits a, substantially, pure light wave 154 in the red range. The reflector 160 transmits a small percentage of the light waves 144, 152 and 154. The filter 162 is a variable density filter.

In this manner I realize a, substantially, pure blue light wave 144 having a wave length in the range of about 4000 A to 5000 A; a, substantially, pure yellow light wave 152 having a wave length in the range of about 5000 A to 6000 A; and, a, substantially, pure red light wave 154 having a wave length in the range of about 6000 A to 7000 A. Also, there is realized a small proportion of light waves 144, 152 and 154 which function as a complementary color in the color separation and the reproduction process.

As a modification of the system of FIG. 17 there is illustrated in phantom line the filter 162 for receiving the light waves 144, 152 and 154 from the reflector 156. The filter 162 will absorb and/or reflect, as previously explained, the light waves 144 and 152 and transmit a, substantially pure, light wave 154 in the red range. With the configuration showing the filter 162 in line with the reflector 156 it is not necessary to have the reflector 160 and there is not produced the small percentage of color 144, 152 and 154 comprising a complementary color.

It is to be realized that the configuration in FIG. 17 can be different so that the reflector 142 need not be the first reflector but can be the second or third reflector and that the reflector 156 can be the first or third reflector and the reflector 160 can be the first or second reflector, with consequent changes in the position of the filters 146, 158 and 162. The arrangement of the reflectors and filters can be varied. Further, it is to be realized that the reflectors 142, 156 and 160 can be the reflectors 50, 60, 62, 70 and 80 of FIGS. 1 through 5, as previously described. Also, the filters 146, 158 and 160 can be the filters 90, 92, 100, 110, 114, 120 and 126 of FIGS. 7 through 13, as, previously, described. The variable density filters 146, 158 and 162 can be activated by the electromagnetic waves from the reflectors 142, 156 and 160.

In FIG. 17 the length of the lines for the blue wave lengths 144, yellow wave lengths 152 and red wave lengths 154 are symbolic and, to a degree, try to illustrate the percent of light waves reflected and transmitted. The length of these lines is not an accurate measurement of the percent of light waves reflected and transmitted but is a symbolic representation to convey to the viewer the reflection, transmission and filtration of the light waves to achieve a, substantially, pure light wave.

Figure 18:
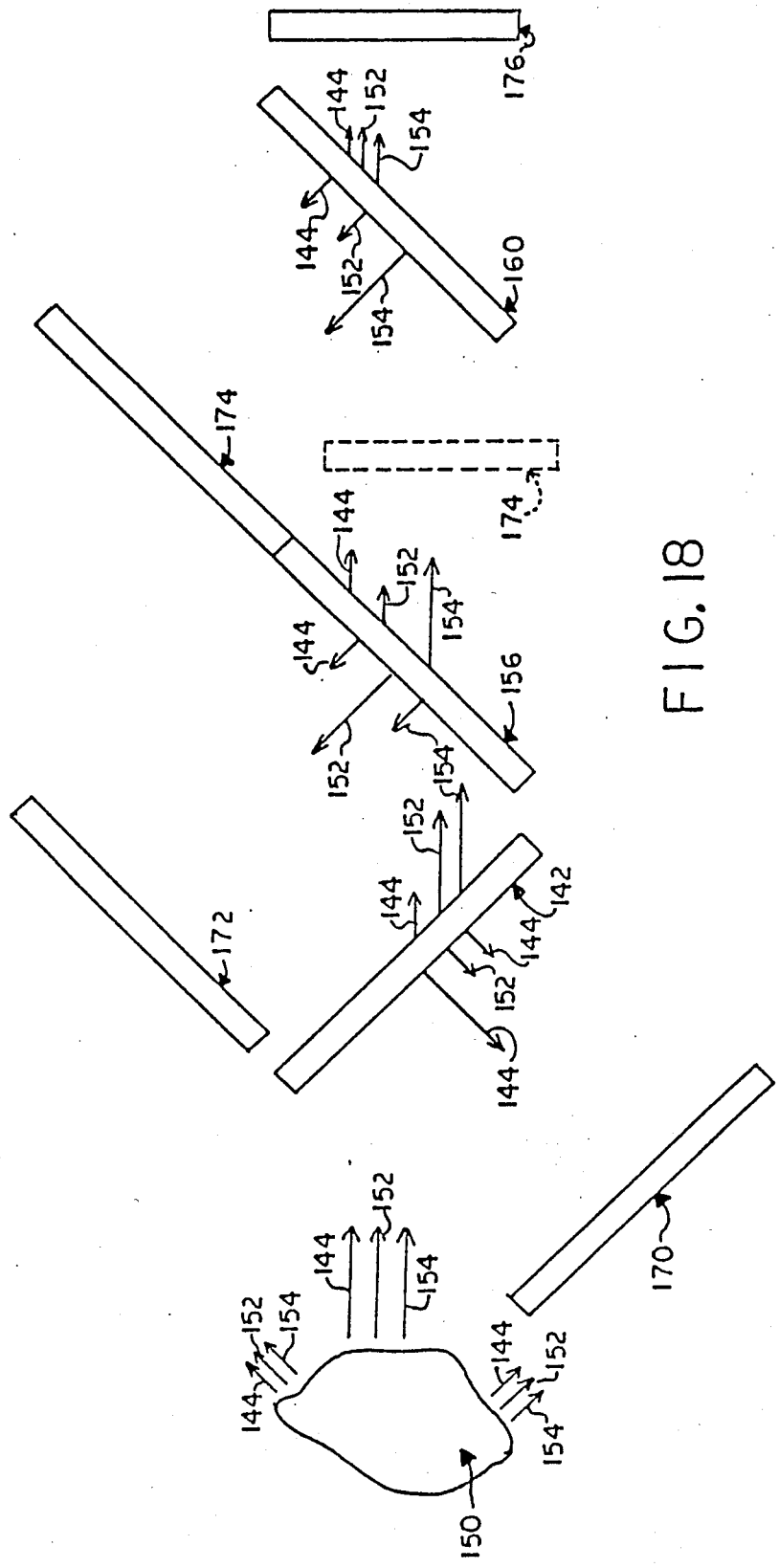
FIG. 18 is a schematic illustration of an arrangement of dichroic reflectors and photosensitive emulsions for the photosensitive emulsions being activated by selective ranges of desired wave lengths.

In FIG. 18 there is illustrated a series of reflectors and film for recording the desired wave length reflected. More particularly, there is the reflector 142, the reflector 156, the reflector 160, as previously described with respect to FIG. 17. Also, there is the geometric image 150 and the light waves 144, 152 and 154 from the geometric image 150. Again, the reflector 142 reflects substantially all of the light waves 144 to photosensitive emulsion 170. Photosensitive emulsion 170 is activated by the light waves 144. The photosensitive emulsion 170 may be sensitive only to the light waves 144 or may have an absorption material for absorbing the light waves 152 and 154 in transmitting the light waves 144.

The reflector 156 reflects the light waves 152 to the photosensitive emulsion 172. The photosensitive emulsion 172 may be sensitive only to the light waves 152 or may have an absorption means for absorbing the light waves 144 and 154 and for transmitting the light waves 152.

Further, the reflector 160 may reflect the light waves 154 to the photosensitive emulsion 174. The photosensitive emulsion 174 may be sensitive only to light waves 154 or may comprise absorption means for absorbing the light waves 144 and 152. The reflector 160 transmits a small percent of the light waves 144, 152 and 154 to the photosensitive emulsion 176. The photosensitive emulsion 176 is sensitive to the light waves 144, 152 and 154 and, may for example, be a panchromatic emulsion.

In FIG. 18 it is seen that there is, in phantom, the film 174. The film 174 is in line with the light waves transmitted from the reflector 156. Also, in the FIG. 18 it is not necessary, when having the film 174 in line with the reflector 156 to have the reflector 160. The photosensitive emulsion 174 is sensitive to the light waves 154, as previously explained, and may have an absorption means for absorbing the light waves 144 and 152. With the photosensitive emulsion 176 there is produced a complementary color. With the photosensitive emulsion 176 there are four photosensitive emulsions, one for blue, one for yellow, one for red, and, the photosensitive emulsion 176 for the complementary color. Without the photosensitive emulsion 176 there is no complementary color and the photosensitive emulsions 170, 172 and 174 are activated by the blue, yellow and red light waves.

In FIG. 18 the reflectors 142, 156 and 160 may be the reflectors 50, 60, 62, 70 and 80 of FIGS. 1 through 5. Also, the photosensitive emulsions 170, 172, 174 and 176 may be those photosensitive emulsions as referred to by reference numerals 130 and 136 of FIGS. 15 and 16, or may be panchromatic emulsions.

Figure 19:
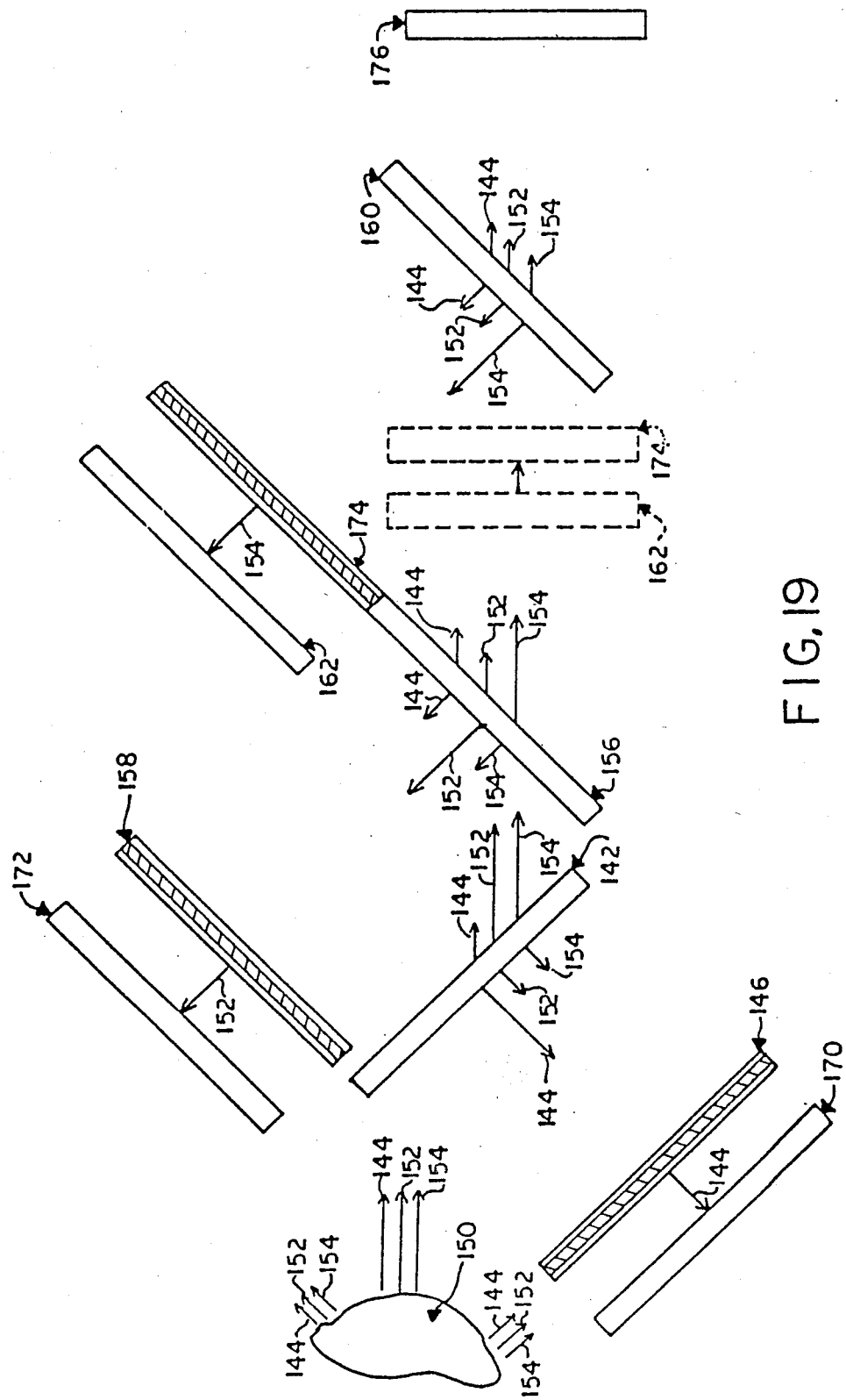
FIG. 19 is a schematic diagram of an arrangement of dichroic reflectors, variable density filters and photosensitive emulsions for the separation of wave lengths into selected ranges of desired wave lengths and for activating the photosensitive emulsions by the selected ranges of desired wave length.

In FIG. 19 there is illustrated a combination of reflectors, variable density filters and film.

The light waves from the geometric image 150 are partially reflected and partially transmitted by the reflector 142. The reflector 142 reflects, substantially, all of the light waves 144 to the filter 146. The filter 146 transmits, substantially, pure light waves 144 to the photosensitive emulsion 170 which is activated, as previously explained.

The reflector 142 transmits, substantially, all of the light waves 152 and 154 to the reflector 156 which, in turn, reflects, substantially, all of the light waves 152 to the variable density filter 158. The variable density filter 158 transmits light waves 152 to the photosensitive emulsion 172.

The reflector 156 transmits, substantially, all of the light waves 154 to the reflector 160 which reflects, substantially, all of the light waves 154 to the variable density filter 162. The variable density filter 162 transmits, substantially, pure light waves 154 to the photosensitive emulsion 174.

The reflector 160 transmits a small percentage of the light waves 144, 152 and 154 to the photosensitive emulsion 176.

The photosensitive emulsion 170 is activated by the blue light waves 144; the photosensitive 172 is activated by the yellow light waves 152; the photosensitive emulsion 174 is activated by the red light waves 154; and, the photosensitive emulsion 176 is activated by the complementary color comprised in the light waves 144, 152 and 154. The photosensitive emulsions 170, 172, 174 and 176 may be panchromatic emulsions.

In FIG. 19 it is seen that the variable density filter 162 and the photosensitive emulsion 174 are in the phantom lines and in direct line with the light waves from the reflector 156. In this configuration it is not necessary to have the reflector 160 and the photosensitive emulsion 176 as the red light waves 154 are directed in a, substantially, pure form to the photosensitive emulsion 174.

It is seen that the system of FIG. 19 is a combination of the systems of FIG. 17 and FIG. 18. Again, the reflectors 142, 156 and 160 may be the reflectors 50, 60, 62, 70 and 80 of FIGS. 1 through 5. Also, the variable density filters 146, 158 and 162 may be the variable density filters 90, 92, 100, 110, 114, 120 and 126 of FIGS. 7 through 13. And, the photosensitive emulsions 170, 172, 174 and 176 may be the photosensitive emulsions 130 and 136 of FIGS. 15 and 16, or may be panchromatic emulsions.

Figure 20:
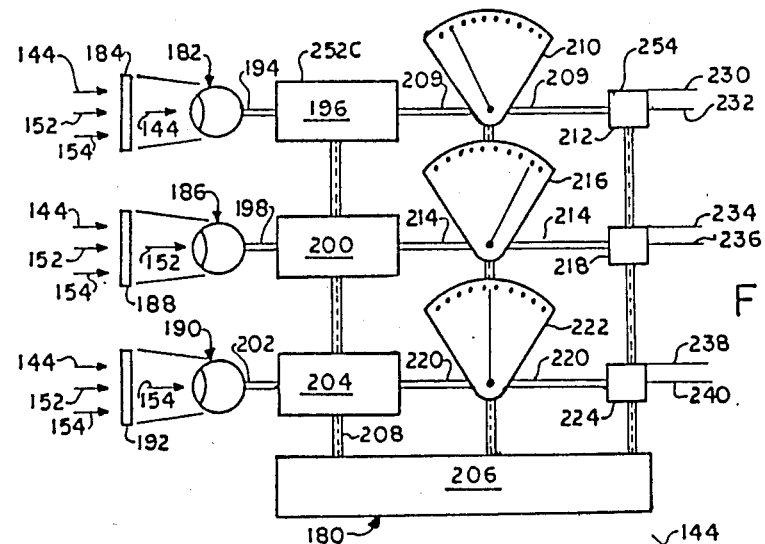
FIG. 20 is a schematic illustration of the selective wave length sensor and control for the variable density filter and, as illustrated, for three variable density filters.

In FIG. 20 there is illustrated a selective wave length sensor and control 180.

The sensor and control 180 comprises three sensing means for the light waves in the general range of the blue light, 4000 A to 5000 A, yellow light in the range of 5000 A to 6000 A and red light in the range of 6000 A to 7000 A. There is a first photosensing element 182. In front of the element 182 there is a color filter 184 for transmitting light waves 144, blue light waves in the range of 4000 A to 5000 A and absorbing the light waves 152 and 154, see FIGS. 17, 18 and 19 and the explanation for these figures. Also, there is a sensor 186 and a color filter 188. The color filter 188 transmits yellow light waves 152 in the range of 5000 A to 6000 A and absorbs the light waves 144 and 154. Also, there is a light sensitive means 190 and a corresponding color filter 192. The color filter 192 transmits red light waves 154 in the range of 6000 A to 7000 A an absorbs the light waves 144 and 152.

The light sensitive means 182 by means of appropriate circuitry 194 connects with a photomultiplier 196. The light sensitive means 186 by means of appropriate circuitry 198 connects with a photomultiplier 200. The light sensitive means 190 by means of appropriate circuitry 202 connects with a photomultiplier 204.

There is a power source 206 which connects with the photomultipliers 196, 200 and 204. The power source may be alternating current or direct current as appropriate. The power source 206 connects with the photomultipliers 196, 200 and 204 by appropriate circuitry 208.

The photomultiplier 196 by means of circuitry 208 connects with a light volume indicator 210, graphically illustrated in FIG. 20. Also the photomultiplier 196 connects with a control 212 by means of the circuitry 208.

The photomultiplier 200 by means of circuitry 214 connects with the light volume indicator 216, graphically illustrated in FIG. 20, and also connects with the control 218.

The photomultiplier 204 by means of appropriate circuitry 220 connects with a light volume indicator 222 and also connects with the control 224.

The controls 212, 218 and 224 control the means for exciting the photochromic materials or phototropic materials in the variable density filter.

The light volume indicators 210, 216 and 222 are responsive to the electrical impulses or electrical signals from the photomultipliers 196, 200 and 204 and give a graphical illustration of the light volume.

In FIG. 20 it is seen that the control 212 has electrical lines 230 and 232; the control 218 has electrical lines 234 and 236; and, the control 224 has electrical lines 238 and 240.

Figure 21:
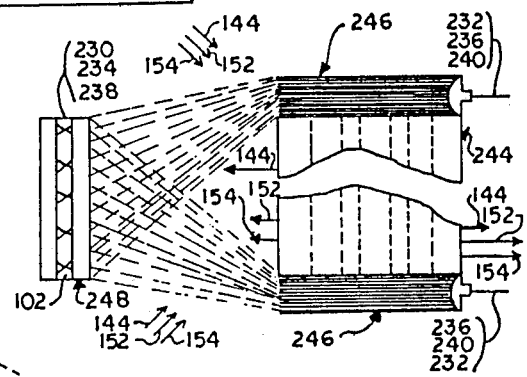
FIG. 21 is a schematic illustration of an exciting means for exciting the photochromic material or the phototropic material of the variable density filter.

In FIG. 21 there is, schematically, illustrated a reflector 244 for, selectively, reflecting light waves of a certain wave length and transmitting light waves of another wave length. By way of example the light waves 144, 152 and 154 can be directed to the reflector 244. The reflector 244, selectively, reflects the blue light waves 144 and, substantially, transmits the yellow light waves 152 and the red light waves 154. This is illustrated by the length of the lines 144, 152 and 154 in FIG. 21 and, as already explained with reference to FIGS. 17, 18 and 19. There is associated with the reflector 244 an exciting means 246. It is to be clearly understood that the exciting means 246 need not be physically connected to the reflector 244 and may be positioned away from the reflector 244. Or, the exciting means may be juxtapositioned to the reflector 244 as illustrated in FIG. 21. The exciting means will direct electromagnetic radiations to a filter 248. The filter 248 is for transmitting blue light waves 144 and for absorbing and/or for absorbing and reflecting light waves 152 and 154, as, previously, explained. The control for the exciting means 246 is a control 212 and connects with the exciting means 246 by means of the line 232. In certain instances it may be desirable to use a filter such as filter 100, 114 or 120 of FIGS. 9, 11 and 12 wherein there is a unit 102 for varying the temperature of the variable density filter or a bus bar arrangement 122 and 124. Then, the variable density filter 248 connects with the control 212 by means of electrical connection 230 or electrical line 234.

It is to be realized that the reflector 244 can be selective for transmitting wave lengths 152 and reflecting wave lengths 144 and 154 or for transmitting wave lengths 154 and reflecting wave lengths 144 and 152. Where appropriate, the control for the exciting means 246 may be the control 218 connecting with the exciting means 246 by means of electrical connection 236 or the control may be control 224 connecting with the exciting means 246 by means of the electrical connection 240. Also, where appropriate the control for the variable density filter 248 may be the control 218 connecting by means of electrical connection 234 or may be the control 224 connecting by means of the electrical connection 238.

Again, the reflector 244 may be a reflector, where appropriate, reflector 50, 60, 62, 70 or 80 as previously described and illustrated with respect to FIGS. 1 through 5 and, the filter 248 may be a filter 90, 92, 100, 110, 114, 120 and 126, where appropriate, as previously described with respect to FIGS. 7 through 13.

The exciting means 246 may be a source of ultra-violet electromagnetic radiation or infra-red electromagnetic radiation and may comprise fiberoptics to assist in the distribution of the radiation onto the variable density filter 248. As is well known the ultra-violet radiation and the infra-red radiation excite the photochromic materials or the phototropic materials in the variable density filter 248.

To lessen the excitement of the photochromic materials or phototropic materials in the variable density filter 248 it may be necessary to resort to one of many situations such as deactivating the exciting means 246 by turning off the exciting means 246 to assist in returning the photochromic materials to the original pellucid state; to direct a white light onto the variable density filter 248 to return the photochromic materials to their original pellucid state. The exciting means may incorporate three sources of wave lengths such as a blue wave length, a yellow wave length and a red wave length, in the appropriate mixture or intensity to form a white light for radiating the variable density filter 248 to return the photochromic materials to their original pellucid state. Another means for deactivating the photochromic materials in the variable density filter 248 would be to decrease the temperature of the variable density filter 248. One way of decreasing the temperature of the filter 248 would be to cool the filter 248 by letting the layer 102 generate electricity and dissipate the electricity outside of the filter 248. Another way of expressing this is for the filter 248 to have an inversion coupler for lowering the temperature of the variable density filter 248.

In FIG. 20 it is seen that an electrical connecting means 252 connects with the photomultipliers 196, 200 and 204. Also, an electrical connecting means 254 connects with the controls 212, 218, and 224.

Figure 22:
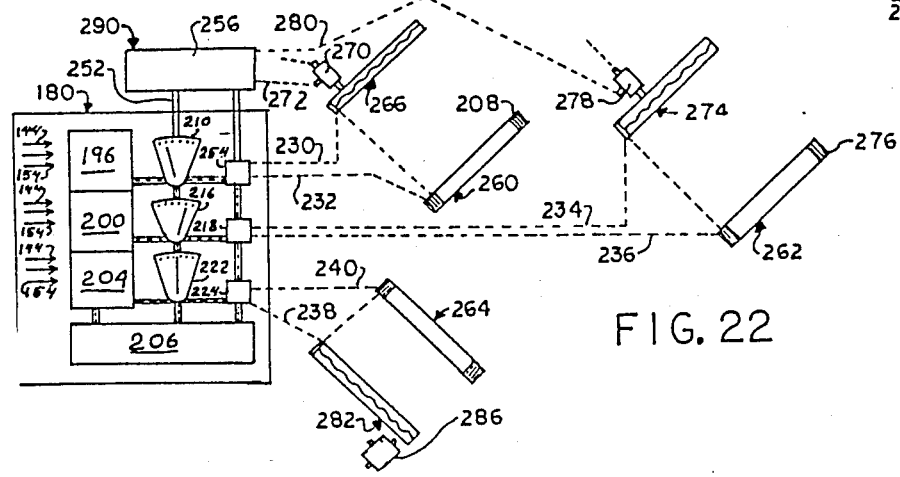
FIG. 22 is a schematic illustration of a combination of a selective wave length sensor and control and power source for exciting the variable density filter.

In FIG. 22 it is seen that the selective wave length sensor and control 180 connects by the electrical connecting means 252 and 254 with a power source 256.

In FIG. 22 it is seen that there is a first reflector 260, a second reflector 262 and a third reflector 264.

There is associated with the first reflector 260 a first variable density filter 266. An exciting means 268 is associated with the reflector 260 and connects with the sensor and control 180 by means of electrical connection 232. There may be an electrical connection 230 between the variable density filter 266 and the sensor and control 180. The power source 256 connects with a suitable recording means 270, such as a photoscanner, by means of an electrical connection 272.

Likewise, there is associated with the reflector 262 a variable density filter 274. Associated with the reflector 262 is an exciting means 276 for the filter 274. The exciting means 276 connects with the sensor and control 180 by means of the electrical connection 236. Where appropriate the variable density filter 274 connects with the sensor and control 180 by means of an electrical connection 234. There may be a recording means associated with the variable density filter 274, such recording means being a photoscanner 278. The photoscanner 278 may connect with the power source 256 by means of an electrical line or connection 280.

Likewise, there is associated with the reflector 264 a variable density filter 282. Associated with the reflector 264 is an exciting means 284 for exciting the filter 282. An electrical line 240 connects with the exciting means 284 and also with the sensor and control 180. Where appropriate, an electrical line 238 connects with the variable density filter 282 and the sensor and control 180. There may be a recording means 286 associated with the variable density filter 282, such recording means being a photoscanner. The photoscanner 286 connects with the power source 256 by means of an electrical connection 288. In certain instances, it may be desirable to have a fourth recording means such as a photoscanner for complementary color.

The reflector 260 may, selectively, reflect blue light in the range of 4000 A to 5000 A and transmit yellow and red light. The reflector 262 may reflect yellow light in the range of 5000 A to 6000 A and transmit blue and red light. Also, the reflector 264 may reflect red light in the range of 6000 A to 7000 A and transmit blue and yellow light.

For ease of illustration and explanation the selective wave length sensor and control 180 and the power source 256 will, hereafter, be referred to by reference numeral 290, a combination of a selective wave length sensor and control and power source.

In FIG. 23 there is a symbolic representation of the use of the reflectors, variable density filter and the combination of a selective wave length sensor and control and power source 290 to achieve a, substantially, pure color for recording on such as photosensitive emulsion, with a photoscanner, with a photoscanner for converting to digital information or for converting to analogue information or for recording on tape such as magnetic tape or other recording means. FIG. 23 is a combination of FIGS. 19 and 22. In fact, FIG. 23 is a result of the evolution and combination of FIGS. 17, 18, 19, 20, 21 and 22. I have tried to lead the reader by the hand from FIG. 17 through FIG. 22 so as to build and lay a background for FIG. 23. The appropriate reference numerals in FIG. 23 may be found in FIGS. 17 through 22. There is a geometric image 150. The wave lengths 144, 152 and 154 pass to the combination selective wave length sensor and control and power source 290 and also to the reflector 142. The reflected blue light 144 goes to the filter 146. The radiation means 268 can radiate the filter 246. There may be a recording means such as a photosensitive emulsion 170 or there may be a recording means such as a photoscanner 270. Again, the use of the photosensitive emulsion 170 and the photoscanning means 270 are symbolic in the sense that under normal circumstances a photoscanning means 270 will not be used in conjunction with the photosensitive emulsion 170. For ease of illustration both are illustrated in FIG. 23. There is an electrical connection means 300 connecting with the photoscanner 270. The electrical connection means 300 can connect with another recording means.

From the reflector 142 the light waves travel to the reflector 156. The reflector 156 reflects, mainly, the yellow light waves 152 which are directed to the variable density filter 158. Associated with the reflector 156 is an exciting means 276 for exciting the variable density filter 158. The light waves 152 from the variable density filter 158 pass to recording means such as a photosensitive emulsion 172 or a photoscanner 278. The photoscanner 278 by means of an electrical connection 302 goes to a recording means.

The reflector 156 transmits, mainly, light waves 154 which flow to the reflector 160. The reflector also reflects the light waves 154 to the variable density filter 162. There is associated with the reflector 160 an exciting means 284 which activates the photochromic properties of the variable density filter 162. From the variable density filter 162 the light waves 154 flow to a recording means such as a photosensitive emulsion 174 or a photoscanner 286. The photoscanner 286 may connect with another recording means by an electrical connection 304.

From the reflector 160 there flows the complementary color comprising wave length 144, wave length 152 and wave length 154. The complementary color flows to recording means such as a photosensitive emulsion 308 or a photoscanner 310. The photoscanner 310 connects with the combination of a selective wave length sensor and control and power source 290 by means of electrical connection 312. Also, the photoscanner connects with recording means by an electrical connection 314.

In FIG. 23 it is seen that there is a recording means 316 connecting with the appropriate photoscanners by the electrical connections 300, 302, 304 and 314. The recording means 316 may be a magnetic tape for recording digital information and analogue information or may be other appropriate recording means such as a photosensitive emulsion. Such recordings may be recorded as separate individual colors such as blue color, red color and yellow color, or may be combined and recorded as one color or, separately, recorded on one recording medium. Also, the information contained in the recording may be used for projection purposes at a more suitable time or a more suitable place. For example, the photoscanners may send the information to appropriate means such as cathode ray tubes for projection onto a cathode ray screen wherein the colors, as beams of electrons, are converged so as to recreate the original image 150 on a cathode ray screen. In other words, this system has value in making a clear projection 150, in color, on a cathode ray screen such as in color television.

Further, with the photosensitive emulsions 170, 172, 174, and 308, it is possible to make color separations for use in colored printing. With the reflectors reflecting, substantially, pure light such as blue light or yellow light or red light and also with filters absorbing light other than the desired light, it is possible to realize a, substantially, pure light. This pure light may be blue or yellow or red. In color printing the basic color separations are blue, yellow and red. In certain instances where it is desired and deemed necessary there may be used the complementary color comprising the colors 144, 152 and 154 to activate the photosensitive emulsion 308. From the foregoing, it is seen that I have provided a system, as outlined in FIG. 23, wherein the colors are not absorbed to subtract from the initial energy. In fact, substantially all of the pure colors are transmitted to the recording means such as a photosensitive emulsion or to the photoscanners. In many color separation processes the undesirable colors are absorbed reducing the overall color intensity or color density. In my system it is seen that the undesirable colors are not absorbed but are reflected and transmitted and the small amount or small percentage of extraneous color which is not desired is absorbed by a variable density filter. This means that, substantially, all of a pure color and almost all of the color as originated from the basic geometric image is transmitted to the recording means such as the photosensitive emulsion or to the photoscanner. In other words my process is not a subtractive process for absorbing a large quantity of light waves to produce the, substantially, pure color. Instead, my process is a process for separating a selective band width of light waves from other light waves by reflection and transmission and then absorbing the small percent or small quantity of the light waves outside the selected band width of light waves to produce, substantially, pure color.

One of the beneficial side effects of my system and process is that I produce, substantially, pure color waves in desired wave length bands or desired wave length ranges. This means that there is not the neccesity to make color corrections or to mask for the color wave lengths outside of the desired selected color bands or selected color wave lengths. More particularly, in making color separations, either negatives or positives, it is often necessary to mask the color separation or to remove those colors in a particular color separation outside the desired colored band width. For example, in a color separation for blue, prior to my invention, there was often some yellow color and some red color. It was necessary to mask the blue color separated negative or positive to remove the yellow and red or to make correction for the yellow and red colors. This masking or removal of the colors outside the blue color was done in a separate process and which process was time consuming and expensive. My example can be expanded to state the same for a selected band with the color in the yellow range from about 5000 A to 6000 A. In the color separated negative or positive, there would be some blue color and also some red color. Again, it was necessary, prior to my invention, to mask the color separated negative or positive or to make corrections, in a separate process, to remove the undesirable blue and red colors from the yellow separated negative or positive. This example can be expanded for red to make corrections for blue and yellow colors in the red separated negative or positive.

Also, from the foregoing, it is seen that I have provided a means and a method for making color separations either in blue and yellow and red or in blue and yellow and red and the complementary color and which color separations are of substantial purity and can be used for making colored prints without the necessity of making corrections or masks. Another advantage flowing from my means and method with regard to color separations is that, prior to this invention, the time required to make a set of colored separations, either three or four colored separations, would be hours as it is necessary to make each color separation in a separate step. With my invention, it is possible to make a set of color separations, either three color separations or four color separations, simultaneously, and, essentially, in the time required to develop the photosensitive emulsions, which is, with automatic processing, approximately, three to five minutes and with manual processing somewhat longer.

Another benefit from my invention is that it is possible to make a recording of, substantially, pure color in digital information or analog information and to dispense with photosensitive emulsions. In other words, the photosensitive emulsion or film can be eliminated and yet color can be reproduced from the digital information or analog information stored on a recording material such as a magnetic tape or other suitable recording material. As previously stated, it is possible to take this stored information and to introduce it into a cathode ray tube, under proper means and circumstances, such as color television and reproduce the substantially pure colors upon being converged to form a replica of the original geometric image 150. Further, this stored information, in digital form or analog form, in its separated form, is used for making etched plates, three etched plates or four etched plates, for use in color printing such as lithographic printing, gravure printing or engravings. To repeat, it is possible with my means and method to eliminate the use of photosensitive emulsions for making color separations and to go directly from the geometric image from the variable density filter to making etched plates for lithographic printing or rotogravure printing or etchings. From this, it is seen that there is a saving in time and also a saving in steps by eliminating activating a photosensitive emulsion to make a series of color separations of three separations or four separations as it is possible to make three or four plates, simultaneously, for colored printing.

The system diagrams of FIGS. 17, 18, 19 and 23 may be used for geometric imaging without a lens or a lens means. In other words, the systems of these figures are lensless or, as sometimes termed, holographic systems. The systems of FIGS. 17, 18, 19 and 23 are lensless image recreations. Such systems may be used in holography and methods wherein the geometric images are recreated by electrical impulses.

Figure 25:
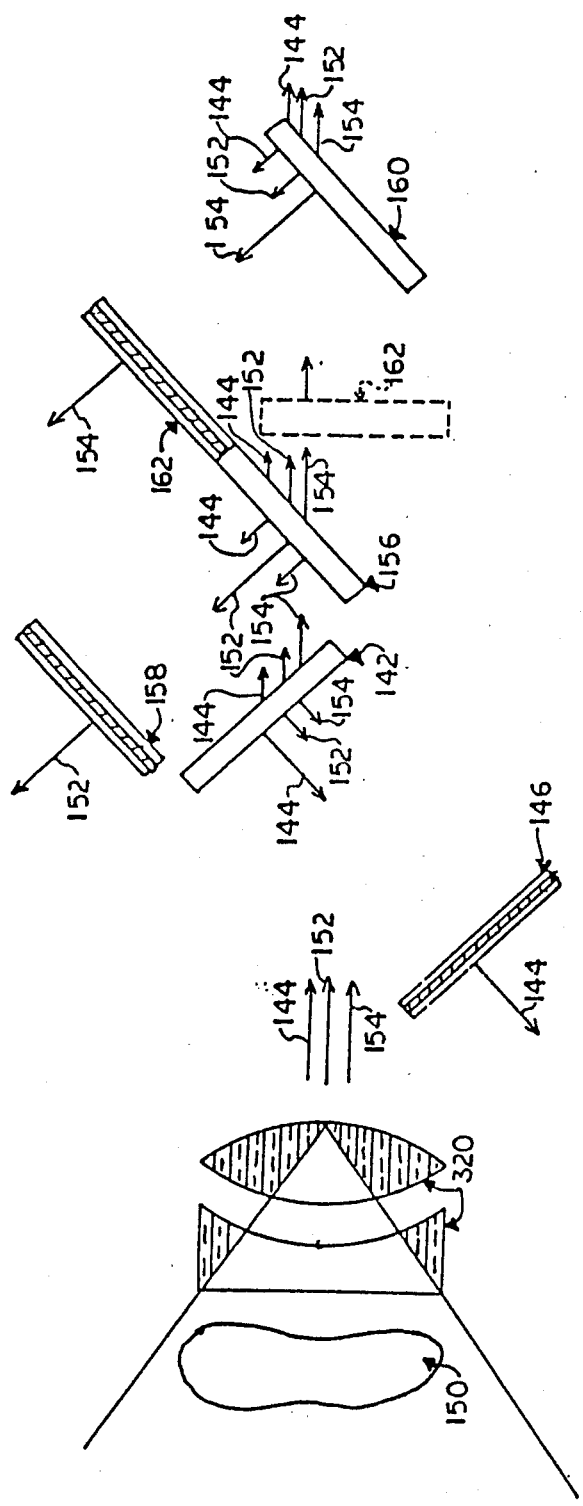
FIG. 25 is a schematic illustration of a lens, dichroic reflectors, and variable density filters for separating wave lengths into selected ranges of desired wave length.

In FIGS. 24 and 25 there is illustrated a system using a collimating lens 320. FIG. 24 is similar to FIG. 18 except in FIG. 24, as contrasted with FIG. 18, there is the collimating lens 320. In FIG. 24 there are reflectors and photosensitive material. The same reference numerals are used in FIG. 24 as are used in FIG. 18, and the comments with respect to FIG. 18 are also applicable with respect to FIG. 24. The reader is put on notice that in FIG. 24 there is the collimating lens 320 while in FIG. 18, the system is a lensless system.

In FIG. 25 there is illustrated a system similar to FIG. 17, but in FIG. 25 there is a collimating lens 320. As is recalled in FIG. 17 there is no lens in the system of FIG. 17 as the system in FIG. 17 is a lensless system. In FIG. 25 the same reference numerals are used for the light waves, the reflectors and the filter as are used in FIG. 17. The comments with regard to FIG. 17 are also applicable to FIG. 25. In FIG. 25, there is illustrated the filters 146, 158 and 162. As explained with respect to FIG. 17, the filters 146, 158 and 162 may be variable density filters. There may not be a separate exciting means for these variable density filters, but the light rays themselves will, to a degree, change the photochromic or phototropic properties of the filters so as to add a variation in absorption of the light waves. In other words, the light waves themselves act as an exciting means. More particularly, the filter 146 can be of the blue range; the filter 158 can be for the yellow range; and, the filter 162 can be for the red range.

Figure 26:
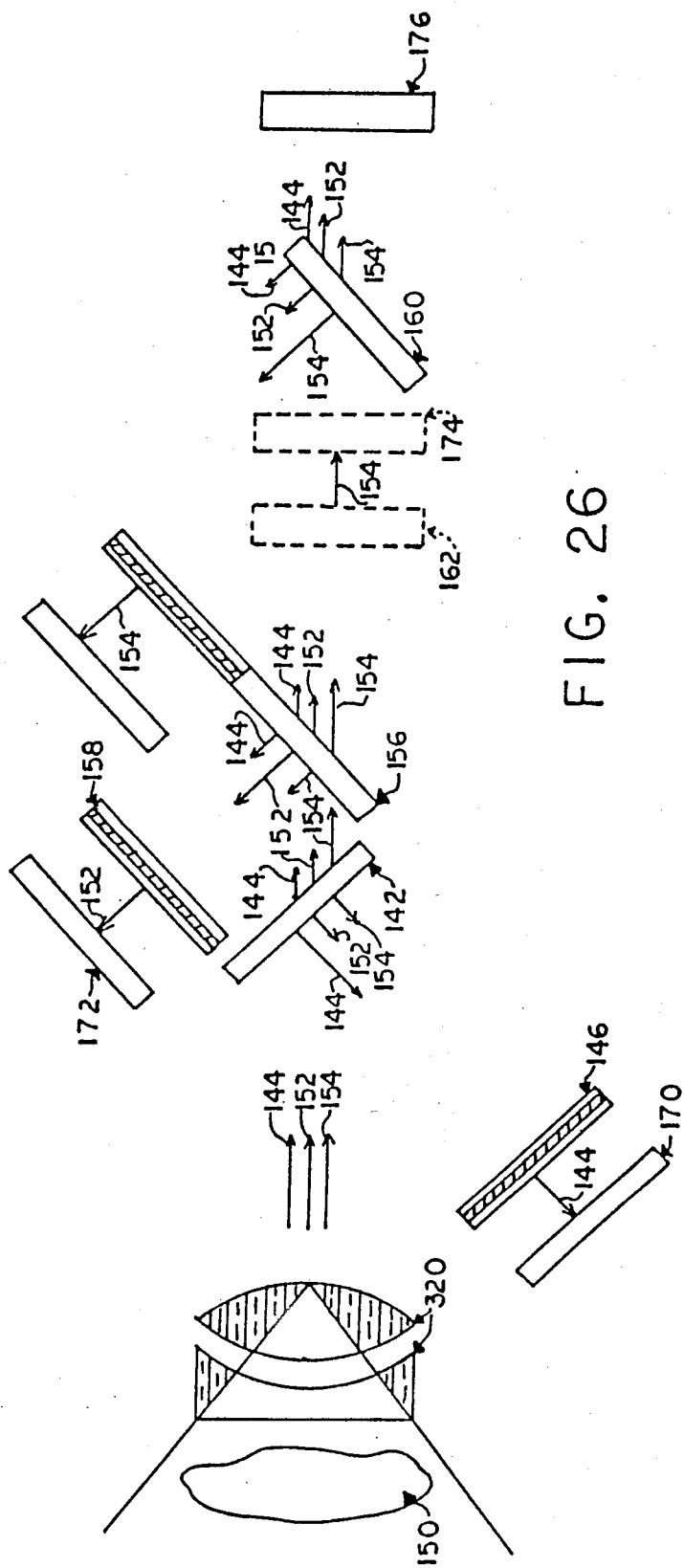
FIG. 26 is a schematic illustration of a lens, dichroic reflectors, variable density filters and photosensitive emulsions for separating wave lengths into desired ranges of wave lengths and activating the photosensitive emulsions.

In FIG. 26 there is illustrated a system using a lens 320. FIG. 26 is similar to FIG. 19 in that there is a series of reflectors, filters, and photosensitive material. It is to be, clearly, understood that in FIG. 26, there is the collimating lens 320 while the system of FIG. 19 is a lensless system or does not have a lens. The reference numerals used in FIG. 19 are also used in FIG. 26 and the comments with respect to FIG. 19 are also applicable to FIG. 26. By way of recall, the filters 146, 158 and 162 can be variable density filters and can be excited by the light waves themselves from the respective reflectors. The filter 146 can be a blue filter; the filter 158 can be a yellow filter; and, the filter 162 can be a red filter. Again, these filters can be a variable density filter. The photosensitive material 170, 172, 174 and 176 can be sensitive to certain wave lengths or colors of a selective wave length or can be a photosensitive material like a panchromatic photosensitive material sensitive to wave lengths in the visible wave length range or can have an absorbing means or an absorption means for absorbing wave lengths other than the wave lengths selected to be transmitted.

In FIG. 27 there is illustrated a system with a lens 320 and which system is similar to the system of FIG. 23. It is to be clearly understood that in FIG. 27 there is a lens or lens means 320 and in FIG. 23 there is no lens, or the system of FIG. 23 is a lensless system. The system of FIG. 27 comprises reflectors, filters, recording material such as photosensitive means or a photoscanner such as the system of FIG. 23. The like components of FIG. 23 and FIG. 27 are given the same reference numerals, and the comments with respect to the system of FIG. 23 are also applicable with respect to the system of FIG. 27. The details of FIG. 27 will not be repeated in order to be more concise, but it is clearly to be understood that the like components of the two systems function in the like manner.

In FIG. 28 there is illustrated a system for converting information in one form to information in another form. The information in one form may be referred to by reference numeral 330 and may be recorded material such as a geometric image on photosensitive material, a color separation, digital information, analog information, material recorded on a magnetic tape, material recorded on a paper tape, and material recorded on a hollerith card, to name a few, or the material 330 may be the information, see FIGS. 17, 19, 23, 25, and 26 and 27, where the information is on the filters 146, 158 and 162 and 308. This information can be observed and read by appropriate means such as a photoscanner or can be read by other appropriate means such as read heads for magnetic tape, paper tape and hollerith cards as indicated by reference numeral 322 which connects with an intense source of radiation 334 such as a quartz-iodine lamp or a monochromatic radiation, commonly known as a laser. An electrical connection means connects the scanning means 332 for the information 330 with the intense source of electromagnetic radiation. The intense source of electromagnetic radiation 334 is directed to a material 336. The material 336 may be a photosensitive material comprising a silver halide such as silver chloride, silver iodine, silver bromide and, even, silver fluoride, or the photosensitive material may comprise an irreversible dyestuff which upon being activated assumes an irreversible form, or the material 336 may be a metal which is etched away to form a plate for printing purposes. There is a power source 338 connecting with the scanning means 332 by an electrical connection 340 and connecting with the intense source of radiation 334 by an electrical connection means 342.

An example of the use of the system of FIG. 28 is one for making plates for use in color printing. If there be three or four color separations, the plate may be made directly from a color separation by scanning the color separation with the scanning means 332 and using the intense source of radiation, such as monochromatic light, to recreate the geometric image on the material 336. Another example of this is that a person may have a page from a newspaper or a page from a printed publication and scan that page by the scanning means 332 and recreating the geometric image on that page on the material 336. Further, it is to be realized that in transforming the information on 330 or the information 330 to the material 336, it is possible to reduce the size of the original geometric image to a smaller size; to retain the size of the geometric image on the material 336 as the same size; or, to enlarge the geometric image on the material 336 as compared with the original geometric image. One value of this is that a printed publication can be reduced in size to make the information 330 or recorded material 330. This means that the information being stored is of small size and can easily be stored and requires less volume for storage. Then, upon recall, this information can be scanned by the scanning means 332 and enlarged to any size desired on the material 336.

In FIG. 29, which is a combination of FIGS. 23, 27 and 28 there is illustrated a system for scanning a geometric image and producing a plurality of recorded images, substantially, instantaneously. The reference numerals common to FIGS. 23, 27 and 28 are also common to FIG. 29.

In FIG. 29 the geometric image may be a color transparency.

In FIG. 29 it is seen that the three ranges of light waves, 144, 152 and 154 are from the geometric image 150 and by means of the reflectors 142, 144 and 160 these three ranges of light waves are separated into, mainly, the blue range 144, the yellow range 152 and the red range 154. Then, the variable density filter 146 transmits, substantially, a pure blue light range 144 which is scanned by the scanner 270 and transmitted by electrical connection 300 to a writing head 334 for making a recording on the recording material 336. Also, the reflector 154 reflects, mainly, yellow light 152 to the variable density filter 158. The variable density filter 158 transmits, substantially, pure yellow range of light 152 which is scanned by the scanner 278. The scanner 278 by means of electrical connection 302 connects with a writing head 340 for making a recording on recording material 342. The reflector 160 reflects mainly, red light 152 and the variable density filter 162 transmits, substantially, a pure red light range 152 which is scanned by the scanner 286. The scanner 286 by means of electrical connection 304 connects with writing head 346 for writing on recording material 348. The dichroic reflector 160 transmits a complementary color comprising the three colors 144, 152 and 154 and which complementary color is scanned by the scanner 310. The scanner 310 connects by electrical connection 314 with the writing head 352 which writes on recording materials 354.

More, particularly, the writing heads 334, 340, 346 and 352 may be a high intensity source of energy such as a laser or monochromatic light, or, even, polychromatic light of high intensity. The recording materials 336, 342, 348 and 354 may be photosensitive material or may be materials to be make into printing plates. From this example it is seen that it is possible to transform a geometric image 150 into substantially pure ranges of color such as 144 for a blue range and 152 for a yellow range and 154 for a red range. Then, these ranges of color can be recorded on suitable recording material. More, particularly, the geometric image 150 can be recorded on the recording materials 336, 342, 348 and 354, substantially, instantaneously, and, simultaneously. With the use of the scanning means 270, 278, 286 and 310 and with the use of the writing heads 334, 340, 346 and 352 it is possible within a very short time period, such as one-tenth of a second, to form the printing plates 336, 342, 348 and 354. It is to be understood that if the geometric image 150 comes from a color transparency or other still subjects, such as a stationary landscape scene or filming of the like, it is not necessary to scan and form the printing plates or recorded material 336, 342, 348 and 354 in one-tenth of a second but a longer time period may be used. Or, with the geometric image 150 being a live subject which may chane position, for example, a model modeling a fur coat or a leather jacket or the like, the separation of the light waves from the live subject and the scanning of the resulting, substantially, pure bands of light waves and the scanning of these, substantially, pure bands of light waves and the making of the printing plates 336, 342, 348 and 354 can be accomplished in a short time period such as one-tenth of a second or, even, less time. From this description and disclosure of the apparatus and method of FIG. 29 it is seen that it is not necessary to first form three or four color separations using standard photographic film procedures and means. And then from the three or four photographic films comprising the color separation the printing plates can be made. Instead, with what I have invented and disclosed the printing plates can be made directly from a color transparency or a live subject. The printing plates can be lithographic plates or gravure plates and can be considered to be etched. Also, the printing plates may be considered to be photosensitive emulsions on a substrate such as paper, metal, plastic, glass and the like. The writing heads 334, 340, 346 and 352 are a high intensity source of energy such as a pulsed laser of other monochromatic or polychromatic sources of light. An example of a polychromatic source of light is the quartz-iodine lamp, a carbon arc. Also, where appropriate the writing heads 334, 340, 346 and 352 can be heads for writing on other materials such as for writing on magnetic tape, punching holes in paper or in plastic, such as paper tape or plastic tape, and Hallerith cards. The information can be in analogue form or can be in digital form.

In summary it is seen that with this invention I have provided a means and method for taking wave lengths from a geometric image and separating these wave lengths into the primary color ranges or bands for blue, yellow and red without any substantial loss of electromagnetic wave energy. Further, the separated bands of primary colors or ranges of primary colors are further refined to a, substantially, pure band of light for each of the primary colors. For example, there results a, substantially, pure blue or range of blue for the range of, approximately, 4000 A to about 5000 A. Similarly, for yellow there results, substantially, a pure band of yellow light or a range of yellow light for the range of about 5000 A to, approximately, 6000 A. And, for red color there results a, substantially, pure red in the range of about 6000 A to about 7000 A. This ability to take the wave lengths from a geometric image and to separate and refine these wave lengths into the three primary color ranges is accomplished, substantially, simultaneously, and, instantaneously without any substantial loss of the electromagnetic wave energy. The three primary ranges of color can be recreated by various methods of reproduction under varied circumstances to form the recreated geometric image. For example, the three primary ranges of color may be recreated, substantially, instantaneously, to form the recreated geometric image. Or, the three, substantially, pure ranges of color may be recorded and recreated at a later period of time. Further, from my invention it is seen that it is possible to achieve, substantially, instantaneously, a color separation of high quality or optimum quality in a, substantially, pure desired range and without the necessity of making color correction. This ability to achieve three, substantially, pure ranges of color for blue, for yellow and for red can be achieved in less time and with less cost than any other means or method I know. An added advantage is that this can be realized without an expert doing the color separation. One of the features that makes possible this realization of, substantially, pure bands or ranges of the three primary colors, blue, yellow and red, is the variable density filter having photochromic materials or phototropic materials, absorbent materials such as dyestuffs, and, where applicable, the ability to, simultaneously, reflect selective wavelengths or colors and to transmit selective wavelengths of colors.

In preparing this patent application I, personally, made a visit to the United States Patent Office and conducted a search to determine the state of the prior art and in my search I found the following pertinent U.S. Pat. Nos. Re 27,491; 2,379,790; 2,560,351; 2,757,232; 2,993,087; 3,001,460; 3,003,391; 3,107,578; 3,127,517; 3,205,767; 3,229,574; 3,237,513; 3,255,026; 3,260,152; 3,269,847; 3,272,646; 3,275,442; 3,278,317; 3,317,321; 3,322,025; 3,331,920; 3,403,262; 3,443,868; 3,467,468; 3,473,863; 3,482,916; 3,493,300; 3,504,971; 3,519,347; 3,536,402; 3,552,824; 3,574,458; 3,577,898; 3,585,281; 3,954,080; 3,630,809; 3,635,555; 3,647,296; 3,649,118; 3,653,759; 3,676,591; 3,679,290; 3,680,956; 3,681,521; 3,694,074; 3,697,174; 3,703,388; 3,704,061; 3,708,676; 3,714,430; 3,724,947; 3,726,584; 2,968,556; 3,193,509; 3,440,051; 3,482,978; 3,486,897; 3,563,748; 3,574,629; 3,672,898; 3,687,670; 3,681,081; 3,714,055; 3,723,422; 3,746,539; 3,322,678; 3,511,653; 3,645,909; 3,660,299.

In making this patent search I searched the following classes and subclasses:

| Class | Subclasses |
| --- | --- |
| 95 | 12.2 |
| 350 | 160, 160P, 166, 171, 172, 173, 288, 290 and 314 |
| 355 | 32, 35, 38, 68, 71 and 77 |
| 356 | 175 |
| 252 | 300 |
| 96 | 84 |

Also, where appropriate, I incorporate the pertinent teachings from the above listed patents in this disclosure.

In FIG. 30 there is presented a system for using variable density filters 400, 402 and 406. The variable density filters 402 and 406 have the ability to reflect light waves of certain wave lengths, transmit light waves of certain wave lengths and absorb light waves of certain wave lengths. An example of such a filter is filter 126, see FIG. 13. And also filter 92, see FIG. 8. These two filters have reflective layers for reflecting wave lengths and for transmitting wave lengths and also have photochromic materials or phototropic materials. Further, filter 110 of FIG. 10, filter 114 of FIG. 11, and filter 120 of FIG. 12 can be used when the photochromic and phototropic materials are in the reflective layers. Again, these variable density filters should have absorption materials such as dyes for absorbing light of certain wave lengths.

The light waves 144, 152 and 154 come from the geometric image 150 and strike the variable density filter 402. The light waves 144 are transmitted and a majority of the light waves 152 and 154 are reflected with some of these light waves being absorbed. The light waves 152 and 154 from the variable density filter 402 strike the variable density filter 400. The majority of the light wave 152 is transmitted and the majority of the light wave 154 is reflected. Again, a small percent of the light waves 144 and 152 are reflected. The light waves from the variable density filter 400 strike the variable density filter 406. A majority of the light wave 154 is transmitted and a small percent of the light waves 144, 152 and 154 are reflected to form the complementary color.

As is seen in FIG. 29, there is a scanning means 270 for the filter 400 and which scanning means 270 connects by means of an electrical connection 300 to a writing head 334 for writing on a recording material 336.

Associated with the variable density filter 402 is a scanning means 278 which connnects by means of electrical connection 302 with a writing head 340. The writing head 340 writes on the recording material 342.

There is associated with the variable density filter 406 a scanning means 286 which connects by means of an electrical connection 304 with a writing head 346. The writing head 346 writes on the recorded material 348.

Also, associated with the variable density filter 406 is a scanning means 310 for scanning the complementary color or the colors for 144, 152 and 154. The scanning means 310 connects with an electrical connection 314 to the writing head 352. The writing head 352 writes on recording material 354.

The above system is a photographic system as it does not employ a lens. There may be a sensor and control 290 having a lens 320. Then, there is a lens system.

There may be associated with the variable density filter 402 and exciting means 268; there may be associated with the variable density filter 400 an exciting means 276.

There may be associated with the variable density filter 406 an exciting means 284.

The writing heads 334, 340, 356 and 352, to repeat, may be a high intensity source of energy such as a monochromatic light or a pulse laser or a polychromatic light or light from a quartz-iodine lamp or a carbon arc or a plasma arc may be writing heads for magnetic tape, paper tape or hollerith cards, to name a few.

The recording material 336, 342, 348 and 354 may be a photosensitive emulsion, metal, plastic, paper and the like.

FIG. 31 is similar to FIG. 17. One or more of the light waves 144, 152 and 154 can be received by 430, a gathering means for the light waves or a recording means or a transmitting or conveying means. The light waves 144, 152 and 154 can contain information. At 432 there is a mechanism for converting the information in the light waves to digital information 434. Then, there is a mechanism 436 for converting the digital information into a form which can be shown on a display 438. The display 438 may be a cathode ray tube, a projector for projecting information onto a screen, electric light bulbs which go on and off for showing the information or light emitting diodes for showing the information, to name a few.

Another path is for the mechanism 440 to receive the information from 430 and to convert the information into analogue information 442. The analogue information is converted by a mechanism 444 into a form which can be used in the display 438. Another path is that for the digital information to be converted by a mechanism 448 into analogue information 442. Then, again, the analogue information 442 can be converted by mechanism 444 into a form which can be shown on display 438.

Display 438 may be a cathode ray tube as used in a television set. In a television set the information is analogue information. However, there is research and development work for using digital information to be converted into a form which can be shown on the display 438. The digital information is so used as to form a better signal which is converted into analogue information for display on the cathode ray tube. It is conceivable that in time the digital information can be used as such with a cathode ray tube display 438. Also, electric light bulbs can be used in an off-off state to illustrate digital information. Likewise, light emitting diodes can be used to display digital information.

FIG. 32 is similar to FIG. 23 and is based on FIG. 23. FIG. 33 is similar to FIG. 27 and is based on FIG. 27. FIG. 34 is similar to FIG. 29 and is based on FIG. 29. FIG. 35 is similar to FIG. 30 and is based on FIG. 30. The comments with respect to FIGS. 23, 27, 20 and 30 are also applicable with the corresponding FIGS. 32, 33, 34 and 35. In FIGS. 32, 33, 34 and 35 it is seen that the electrical connections 300, 302 and 314 connect with 410, a gathering means for a recording means or a transmitting or conveying means for the information being conveyed from the photoscanner by electrical connection 300, 302, 304 and 314. The unit 410 may collect information from only one of the electrical connections or any combination of the electrical connections for the photoscanner. The analogue information 412 from the photoscanners can be converted in mechanism 414 for illustration in the display 416. Or, the digital information 418 from the photoscanners can be converted by mechanism 420 for transmittal to the display 416. Another processing step is to take the digital information 418, and by mechanism 422 convert digital information into analogue information 412. Then, the analogue information 412 can be converted by mechanism 414 for conveyance to display 416. As previously explained with respect to FIG. 31, the display 416 can be a cathode ray tube, a projector for projecting onto a screen, electric light bulbs which go on and off to convey a message or a light emitting diode, to name a few of elements which can be used in the display 416. Again, a common form of a cathode ray tube and the use to which it is placed is a television set. Most television sets function on analogue information. However, there is research and development work for using digital information to make a better picture on the television set. This digital information can be converted into analogue information for use in a cathode ray tube such as in a television set. It is conceivable that in time the digital information can be used without the necessity of going through the analogue information step for use in the display 416. Also, the information from the photoscanners can be processed so as to be projected onto a screen by a projector. A multiplicity of electric light bulbs can be arranged to display information. These electric light bulbs can be activated by analogue information or can be activated by digital information, with the proper equipment. Also, light emitting diodes can be activated by digital information and conceivably by the analogue information, with the proper equipment.

There has been reference to an intense source of radiation. The source of radiation may be a carbon arc light, a plasma arc light, a quartz-iodine light and monochromatic radiation, commonly known as a laser, to name a few.

From the foregoing and having presented my invention what I claim is:

1. A means for controlling electromagnetic wave energy to realize desired wave length light waves, said means comprising:
   a. a control responsive to light waves;
   b. said control in response to said light waves, controlling the electromagnetic wave energy to realize said desired wave length light waves;
   c. said control being a filter;
   d. said control comprising a sensor responsive to said light waves;
   e. said sensor conveying information to a unit for directing electromagnetic waves onto said filter and the intensity of said electromagnetic waves controlling the optical density of the filter;
   f. a means for converting said desired wave length light waves to analogue information;
   g. a display; and,
   h. a means for processing said analogue information into a form for displaying in said display.

2. A means for controlling electromagnetic wave energy to realize desired wave length light waves, said means comprising:
   a. a control responsive to light waves;
   b. said control in response to said light waves, controlling the electromagnetic wave energy to realize said desired wave length light waves;
   c. said control being a filter;
   d. said control comprising a sensor responsive to said light waves;
   e. said sensor conveying information to a unit for directing electromagnetic waves onto said filter and the intensity of said electromagnetic waves controlling the optical density of the filter;
   f. a means for converting said desired wave length light waves to digital information;
   g. a display; and,
   h. a means for processing said digital information into a form for displaying on said display.

3. A means for controlling electromagnetic wave energy to realize desired wave length light waves, said means comprising:
   a. a control responsive to light waves;
   b. said control in response to said light waves, controlling the electromagnetic wave energy to realize said desired wave length light waves;
   c. said control being a filter;
   d. said control comprising a sensor responsive to said light waves;
   e. said sensor conveying information to a unit for directing electromagnetic waves onto said filter and the intensity of said electromagnetic waves controlling the optical density of the filter;
   f. a means for converting said desired wave length light waves to digital information;
   g. a display;
   h. a means for processing said display information into analogue information; and, i. a means for processing said analogue information into a form for displaying in said display.

4. A desired wave length light wave produced by:
   a. analyzing a source of light waves to determine the wave length wave components;
   b. in response to said analysis modifying the electromagnetic wave energy from said sorce to realize said desired wave length light waves;
   c. said desired wave length light wave being converted to analogue information;
   d. said analogue information being processed into a display form; and,
   e. said analogue information in said display form being displayed.

5. A desired wave length light wave produced by:
   a. analyzing a source of light waves to determine the wave length wave components;
   b. in response to said analysis modifying the electromagnetic wave energy from said source to realize said desired wave length light waves;
   c. said desired wave length light wave being converted to digital information;
   d. said digital information being processed into a display form; and,
   e. said digital information in said display form being displayed.

6. A desired wave length light wave produced by:
   a. analyzing a source of light waves to determine the wave length wave components;
   b. in response to said analysis modifying the electromagnetic wave energy from said source to realize said desired wave length light waves;
   c. said desired wave length light wave being converted to digital information;
   d. said digital information being processed into analogue information;
   e. said analogue information being processed into a display form;
   f. said analogue information in said display form being displayed.

7. A lens system for reproducing a geometric image bearing polychromatic light waves by controlling electromagnetic wave energy to form a first desired range of wave length light waves and a second desired range of wave length light waves and a third desired range of wave length light waves, said lens system comprising:
   a. a first variable density filter responsive to said geometric image;
   b. a second variable density filter responsive to said geometric image;
   c. a third variable density filter responsive to said geometric image;
   d. a lens means for directing said geometric image to said first variable density filter, to said second variable density filter, and to said variable density filter;
   e. said first variable density filter producing said first desired range;
   f. said second variable density filter producing said second desired range;
   g. said third variable density filter producing said third desired range;
   h. a photoscanner for determining the optical density and intensity of said desired wave length light waves and for converting said optical information to pulses of electricity and to pulses of electromagnetic waves;
   i. said pulses of electricity comprising analogue information and digital information;
   j. a means for converting said desired wave length light waves to analogue information;
   k. a display; and,
   l. a means for processing said analog information into a form for displaying in said display.

8. A lens system for reproducing a geometric image bearing polychromatic light waves by controlling electromagnetic wave energy to form a first desired range of wave length light waves and a second desired range of wave length light waves and a third desired range of wave length light waves, said lens system comprising:
   a. a first variable density filter responsive to said geometric image;
   b. a second variable density filter responsive to said geometric image;
   c. a third variable density filter responsive to said geometric image;
   d. a lens means for directing said geometric image to said first variable density filter, to said second variable density filter, and to said variable density filter;
   e. said first variable density filter producing said first desired range;
   f. said second variable density filter producing said second desired range;
   g. said third variable density filter producing said third desired range;
   h. a photoscanner for determining the optical density and intensity of said desired wave length light waves and for converting said optical information to pulses of electricity and to pulses of electromagnetic waves;
   i. said pulses of electricity comprising analogue information and digital information;
   j. a means for converting said desired wave length light waves to digital information;
   k. a display; and,
   l. a means for processing said digital information into a form for displaying on said display.

9. A lens system for reproducing a geometric image bearing polychromatic light waves by controlling electromagnetic wave energy to form a first desired range of wave length light waves and a second desired range of wave length light waves and a third desired range of wave length light waves, said lens system comprising:
   a. a first variable density filter responsive to said geometric image;
   b. a second variable density filter responsive to said geometric image;
   c. a third variable density filter responsive to said geometric image;
   d. a lens means for directing said geometric image to said first variable density filter, to said second variable density filter, and to said variable density filter;
   e. said first variable density filter producing said first desired range;
   f. said second variable density filter producing said second desired range;
   g. said third variable density filter producing said third desired range;
   h. a photoscanner for determining the optical density and intensity of said desired wave length light waves and for converting said optical information to pulses of electricity and to pulses of electromagnetic waves;

i. said pulses of electricity comprising analogue information and digital information; and, j. a means for converting said desired wave length light waves to digital information.

10. A lens system for reproducing a geometric image bearing polychromatic light waves by separating electromagnetic wave energy from said geometric image to form a, substantially, pure first desired range of wave length light waves and to form a, substantially, pure second desired range of wave length light waves and to form a, substantially, pure third desired range of wave length light waves, said lens system comprising:

a. a first reflecting for reflecting a majority of said first desired range of wave length light waves to a first variable density filter to realize a, substantially, pure said first desired range of wave length light and for transmitting a majority of said second desired range of wave length light waves;

b. a lens means for directing said electromagnetic wave energy from said geometric image to said first reflector;

c. a second reflector for reflecting a majority of said second desired range of wave length light waves to a second density filter to realize a, substantially, pure said second desired range of wave length light waves and for transmitting a majority of said third desired range of wave length light waves to a third variable density filter to realize a, substantially, pure said third desired range of wave length light waves;

d. a photoscanner for determining the optical density and intensity of said desired wave length light waves and for converting said optical information to pulses of electricity and to pulses of electromagnetic waves;

e. said pulses of electricity comprising analogue information and digital information;

f. a means for converting said desired wave length light wave to analogue information;

g. a display; and, h. a means for processing said analogue information into a form for displaying in said display.

11. A lens system for reproducing a geometric image bearing polychromatic light waves by separating electromagnetic wave energy from said geometric image to form a, substantially, pure first desired range of wave length light waves and to form a, substantially, pure second desired range of wave length light waves and to form a, substantially, pure third desired range of wave length light waves, said lens system comprising:

a. a first reflector for reflecting a majority of said first desired range of wave length light waves to a first variable density filter to realize a, substantially, pure first desired range of wave length light and for transmitting a majority of said second desired range of wave length light waves;

b. a lens means for directing said electromagnetic wave energy from said geometric image to said first reflector;

c. a second reflector for reflecting a majority of said second desired range of wave length light waves to a second density filter to realize a, substantially, pure said second desired range of wave length light waves and for transmitting a majority of said third desired range of wave length light waves to a third variable density filter to realize a, substantially, pure said third desired range of wave length light waves;

d. a photoscanner for determining the optical density and intensity of said desired wave length light waves and for converting said optical information to pulses of electricity and to pulses of electromagnetic waves;

e. said pulses of electricity comprising analogue information and digital information;

f. a means for converting said desired wave length light waves to digital information;

g. a display; and, h. a means for processing said digital information into a form for displaying on said display.

12. A lens system for reproducing a geometric image bearing polychromatic light waves by separating electromagnetic wave energy from said geometric image to form a, substantially, pure first desired range of wave length light waves to to form a, substantially, pure second desired range of wave length light waves and to form a, substantially, pure third desired range of wave length light waves, said lens system comprising:

a. a first reflecting for reflecting a majority of said first desired range of wave length light waves to a first variable density filter to realize a, substantially, pure said first desired range of wave length light and for transmitting a majority of said second desired range of wave length light waves;

b. a lens means for directing said electromagnetic wave energy from said geometric image to said first reflector;

c. a second reflector for reflecting a majority of said second desired range of wave length light waves to a second density filter to realize a, substantially, pure said second desired range of wave length light waves and for transmitting a majority of said third desired range of wave length light waves to a third variable density filter to realize a, substantially, pure said third desired range of wave length light waves;

d. a photoscanner for determining the optical density and intensity of said desired wave length light waves and for converting said optical information to pulses of electricity and to pulses of electromagnetic waves;

e. said pulses of electricity comprising analogue information and digital information;

f. said pulses of electricity comprising analogue information and digital information; and, g. a means for converting said desired wave length light waves to digital information.

13. A method for reproducing, by a lens system, geometric image light waves in a desired range of wave length light waves, said method comprising:

a. by a lens directing said geometric image light waves to a control means having the ability to control and to realize said desired range of wave length light waves;

b. said desired wave length light waves comprising analogue information and digital information;

c. a means for converting said desired wave length light wave to analogue information;

d. a display; and e. a means for processing said analogue information into a form for displaying in said display.

14. A method for reproducing, by a lens system, geometric image light waves in a desired range of wave length light waves, said method comprising:

a. by a lens directing said geometric image light waves to a control means having the ability to control and to realize said desired range of wave length light waves; and, b. said desired wave length light waves comprising analogue information and digital information;
c. a means for converting said desired wave length light waves to digital information;
d. a display; and,
e. a means for processing said digital information into a form for displaying on said display.

15. A method for reproducing, by a lens system, geometric image light waves in a desired range of wave length light waves, said method comprising:

a. by a lens directing said geometric image light waves to a control means having the ability to control and to realize said desired range of wave length light waves;
b. said desired wave length light waves comprising analogue information and digital information;
c. a means for converting said desired wave length light waves to digital information;
d. a display;
e. a means for processing said display information into analogue information; and,
f. a means for processing said analogue information into a form for displaying in said display.

* * * * *